(12) United States Patent  
Numata

(10) Patent No.: US 9,565,381 B2  
(45) Date of Patent: Feb. 7, 2017

(54) SOLID-STATE IMAGE SENSOR AND IMAGE-CAPTURING DEVICE

(71) Applicant: CANON KABUSHIKI KAISHA, Tokyo (JP)

(72) Inventor: Aihiko Numata, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 40 days.

(21) Appl. No.: 14/618,935

(22) Filed: Feb. 10, 2015

(65) Prior Publication Data

US 2015/0229833 A1    Aug. 13, 2015

(30) Foreign Application Priority Data

Feb. 13, 2014  (JP) ................................ 2014-025834

(51) Int. Cl.
*H04N 5/225* (2006.01)
*H04N 5/369* (2011.01)
*H01L 27/146* (2006.01)

(52) U.S. Cl.
CPC ........ *H04N 5/3696* (2013.01); *H01L 27/1461* (2013.01); *H01L 27/14607* (2013.01); *H01L 27/14627* (2013.01); *H01L 27/14629* (2013.01)

(58) Field of Classification Search
CPC ................ H01L 27/14627; H01L 27/14629; H04N 5/3696
See application file for complete search history.

(56) References Cited

U.S. PATENT DOCUMENTS

| | | | |
|---|---|---|---|
| 7,646,943 B1* | 1/2010 | Wober | G02B 6/421 250/227.11 |
| 2005/0139750 A1* | 6/2005 | Dobashi | H01L 27/14621 250/208.1 |
| 2009/0086084 A1* | 4/2009 | Komaba | G03B 13/18 348/349 |
| 2010/0225791 A1* | 9/2010 | Nakayama | H01L 27/14627 348/273 |
| 2010/0230583 A1* | 9/2010 | Nakata | H01L 27/14621 250/227.2 |

(Continued)

FOREIGN PATENT DOCUMENTS

JP   2009-158800 A   7/2009
JP   2010-182765 A   8/2010

*Primary Examiner* — Twyler Haskins
*Assistant Examiner* — Dwight C Tejano
(74) *Attorney, Agent, or Firm* — Canon USA, Inc. I.P. Division

(57) ABSTRACT

A ranging pixel located in a peripheral region of a solid-state image sensor includes a microlens having a center axis that is shifted relative to a center axis of the ranging pixel, a first waveguide, and a second waveguide. The first waveguide is disposed on a side of the center axis of the ranging pixel that is in a direction opposite to a direction (projection shift direction) obtained by projecting a shift direction of the microlens onto a straight line connecting a center of the first waveguide and a center of the second waveguide, and the second waveguide is disposed on another side of the center axis of the ranging pixel that is in a direction identical to the projection shift direction of the microlens. In addition, at least one of the difference between the refractive indices of the core and the clad and the cross-sectional area of the core is greater in the first waveguide than in the second waveguide.

16 Claims, 14 Drawing Sheets

(56) References Cited

U.S. PATENT DOCUMENTS

| | | | |
|---|---|---|---|
| 2011/0169997 A1* | 7/2011 | Nagano | G02B 3/0056 348/340 |
| 2013/0107086 A1* | 5/2013 | Nagano | H01L 27/14607 348/273 |
| 2015/0002713 A1* | 1/2015 | Nomura | H04N 5/23212 348/302 |

* cited by examiner

SOLID-STATE IMAGE SENSOR AND IMAGE-CAPTURING DEVICE

BACKGROUND OF THE INVENTION

Field of the Invention

The present invention relates to solid-state image sensors and image-capturing devices that include solid-state image sensors.

Description of the Related Art

Nowadays, in order to reduce the size of digital cameras, there is a demand for solid-state image sensors that are compatible with camera lenses having a short back focus. In addition, in order to broaden the dynamic range of digital cameras, large-size solid-state image sensors are being used even in small-size digital cameras. In digital cameras that meet the aforementioned demands, light beams are incident on pixels in peripheral regions of the solid-state image sensors at large angles, and thus the light beams are incident on the pixels at positions that are shifted from photoelectric conversion units disposed in the pixels. Consequently, the utilization efficiency of the light beams are reduced, and the sensitivity of the pixels in the peripheral regions decreases.

To address such an issue, Japanese Patent Laid-Open No. 2010-182765 discloses a solid-state image sensor in which microlenses provided on the surface of the pixels are disposed so as to be shifted toward the center of the solid-state image sensor, and the solid-state image sensor is thus capable of detecting light beams incident on the pixels at an angle with high efficiency.

Meanwhile, techniques for detecting a focal point in digital cameras are known. With regard to such techniques, Japanese Patent Laid-Open No. 2009-158800 discloses a solid-state image sensor in which some of the pixels in the solid-state image sensor are provided with a configuration for detecting a focal point through a phase-difference method. In the phase-difference method, images of light rays that have passed through different regions in a pupil of an imaging optical system are compared, and the distance from the focal point to a target of imaging is determined by triangulation of a stereo image. With the technique disclosed in Japanese Patent Laid-Open No. 2009-158800, light beams that have passed through different regions in the pupil of the imaging optical system are coupled, by using microlenses, on interlayer films that are spaced apart from each other. The light beams that have been incident on the interlayer films that are spaced apart from each other are then guided to respective photoelectric conversion units, and the distance is determined on the basis of electric signals from the photoelectric conversion units.

Even with a solid-state image sensor such as the one disclosed in Japanese Patent Laid-Open No. 2009-158800, there arises a problem in that the sensitivity of pixels in the peripheral region decreases when the back focus is shortened or the dynamic range is broadened. To address such an issue, employing a technique in which the microlenses are disposed so as to be shifted toward the center of the solid-state image sensor, as disclosed in Japanese Patent Laid-Open No. 2010-182765, is considered.

However, if the technique disclosed in Japanese Patent Laid-Open No. 2010-182765 is merely applied to the technique disclosed in Japanese Patent Laid-Open No. 2009-158800, another problem as described below arises. Specifically, in a case in which a microlens is disposed so as to be shifted, angles at which principal rays enter respective waveguides differ from each other, and thus coupling efficiencies of the light beams incident on a pixel differ among the plurality of waveguides. Therefore, a difference is produced among the sensitivities of photoelectric conversion units corresponding to the respective waveguides in the pixel, and thus the accuracy in measuring the distance through the phase-difference method is deteriorated.

The present invention is directed to providing a solid-state image sensor that is capable of measuring a distance with high accuracy even in a peripheral region of the solid-state image sensor.

SUMMARY OF THE INVENTION

The present invention provides a solid-state image sensor that includes one or more ranging pixels, and the one or more ranging pixels each include a microlens, a plurality of photoelectric conversion units, and a plurality of waveguides disposed between the microlens and the plurality of photoelectric conversion units so as to correspond to the plurality of photoelectric conversion units. The plurality of waveguides each include a core and a clad. In at least one of the ranging pixels that is located in a peripheral region of the solid-state image sensor, the microlens is so disposed that a center axis thereof is shifted relative to a center axis of the ranging pixel, the plurality of waveguides include a first waveguide and a second waveguide, the first waveguide is disposed on a side of the center axis of the ranging pixel that is in a direction opposite to a direction obtained by projecting a shift direction of the microlens onto a straight line connecting a center of the first waveguide and a center of the second waveguide, the second waveguide is disposed on another side of the center axis of the ranging pixel that is in a direction identical to the direction obtained by projecting the shift direction of the microlens onto the straight line, and at least one of a difference between refractive indices of the core and the clad and a cross-sectional area of the core is greater in the first waveguide than in the second waveguide.

Further features of the present invention will become apparent from the following description of exemplary embodiments with reference to the attached drawings.

DESCRIPTION OF THE EMBODIMENTS

Figure 1:
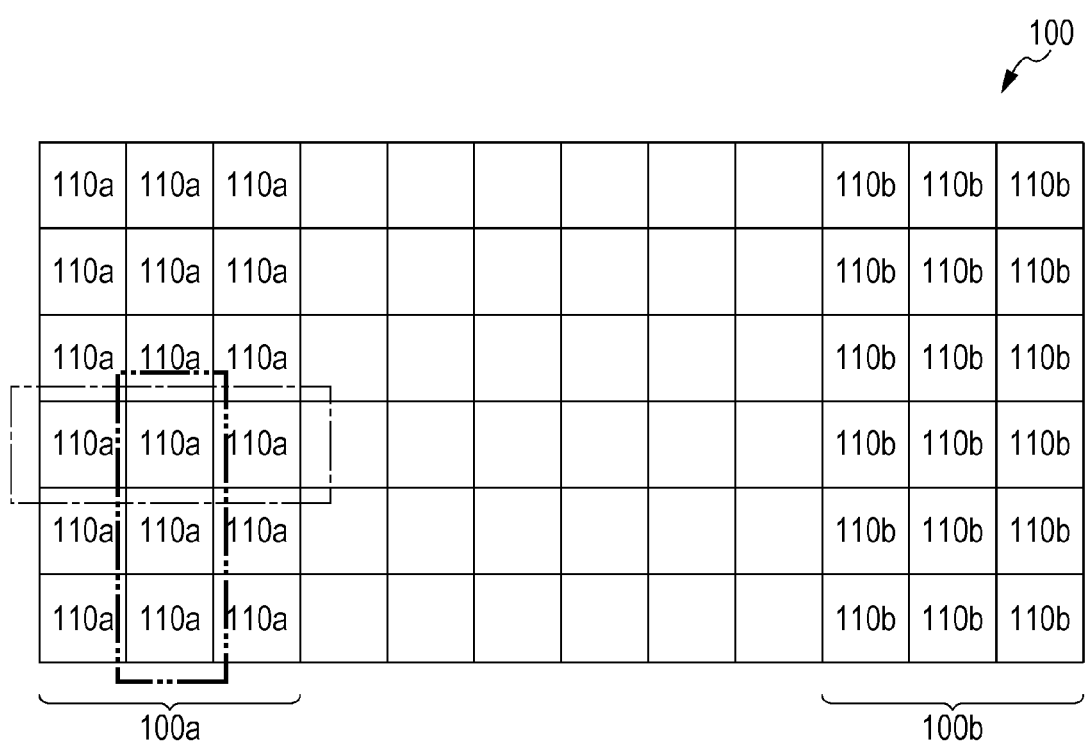
FIG. 1 is a schematic diagram illustrating an example of a solid-state image sensor according to a first exemplary embodiment.
Figure 1:
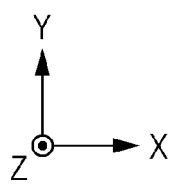

Hereinafter, solid-state image sensors according to exemplary embodiments of the present invention will be described with reference to the drawings. Elements having identical functions are given identical reference characters in the drawings, and repeated descriptions thereof will be omitted.

First Exemplary Embodiment

FIG. 1 illustrates a configuration of ranging pixels in a solid-state image sensor 100 according to the present exemplary embodiment. A ranging pixel is a region that is allocated so as to dispose thereon a set of components, such as a photoelectric conversion unit for obtaining a signal for measuring a distance and an element for outputting a signal, necessary for measuring a distance, and is a region that serves as a repeating unit for disposing such components. Ranging pixels 110a are located in a peripheral region 100a of the solid-state image sensor 100, and the peripheral region 100a is located to the left side on the paper plane. Meanwhile, ranging pixels 110b are located in a peripheral region 100b of the solid-state image sensor 100, and the peripheral region 100b is located to the right side on the paper plane. With regard to a pixel that does not have the reference character 110a or 110b assigned thereto, a ranging pixel may be provided on such a pixel, or a normal image-capturing pixel may be provided on such a pixel. Here, a normal image-capturing pixel is a region that is allocated so as to dispose thereon a set of components, such as a photoelectric conversion unit for obtaining a signal for capturing an image and an element for outputting a signal, necessary for capturing an image, and is a region that serves as a repeating unit for disposing such components. The ranging pixels and the image-capturing pixels may be in the same size or may be in different sizes. The ranging pixels and the image-capturing pixels will be described later. In FIG. 1, the X-direction corresponds to the lengthwise direction of the solid-state image sensor 100, and the Y-direction corresponds to the widthwise direction of the solid-state image sensor 100. The Z-direction corresponds to a direction that is perpendicular to both the X-direction and the Y-direction.

Figure 2A:
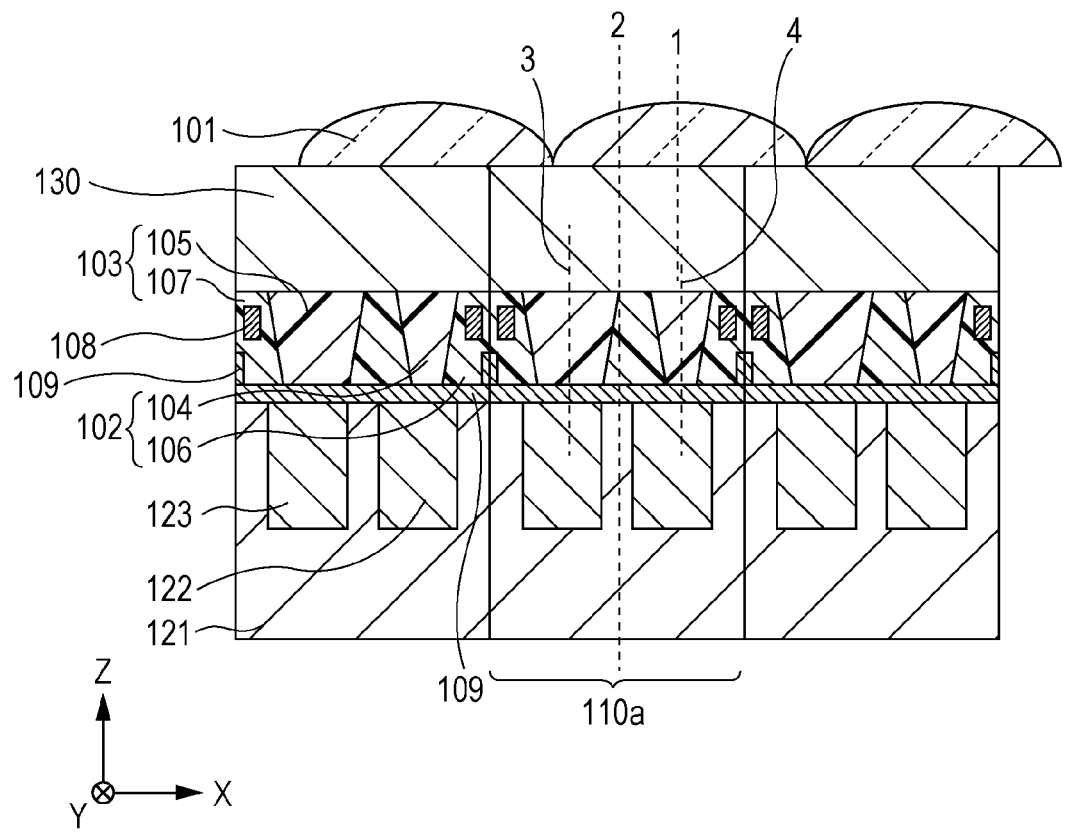
FIGS. 2A and 2B are schematic diagrams illustrating an example of ranging pixels according to the first exemplary embodiment.
Figure 2B:
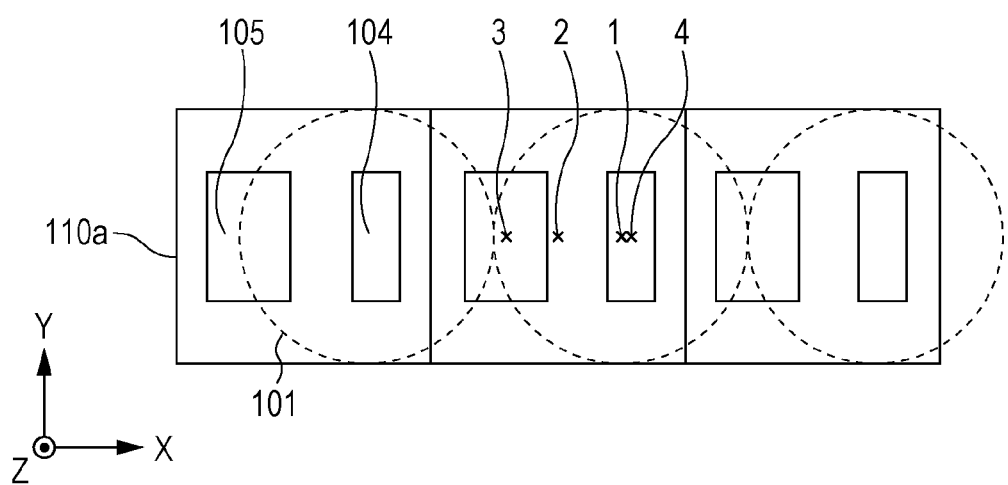

FIGS. 2A and 2B illustrate a layout of the three ranging pixels 110a, enclosed by the dashed-dotted line in FIG. 1, located in the peripheral region 100a of the solid-state image sensor 100 illustrated in FIG. 1. FIG. 2A is a schematic sectional view of the three ranging pixels 110a taken along the XZ-plane. In each of the ranging pixels 110a, a microlens 101, a plurality of waveguides 102 and 103, and a plurality of photoelectric conversion units 122 and 123 formed inside a substrate 121 are disposed from a side on which light is incident on the ranging pixel 110a. FIG. 2B is a schematic plan view of the three ranging pixels 110a along the XY-plane indicated in FIG. 1. The waveguides 103 and 102 are arrayed in this order in the +X-direction. In a similar manner, the photoelectric conversion units 123 and 122 are arrayed in this order in the +X-direction. It is to be noted that the sizes of the photoelectric conversion units 122 and 123 are substantially equal to each other.

The microlens 101 selectively guides light beams passing through different regions in the exit pupil of an imaging optical system (not illustrated) to the respective waveguides 102 and 103. The light beams that have entered the waveguides 102 and 103 are guided, respectively, to the corresponding photoelectric conversion units 122 and 123, and are then converted to electric signals. The electric signals are then transmitted to a signal processing unit (not illustrated) through wires 108 disposed so as to enclose the ranging pixel 110a. Then, the positional shift amount between an image obtained from the electric signal that has been converted by the photoelectric conversion unit 122 and an image obtained from the electric signal that has been converted by the photoelectric conversion unit 123 is obtained, and thus the distance to the target of imaging can be calculated on the basis of the triangulation principle.

As illustrated in FIGS. 2A and 2B, the microlens 101 in the ranging pixel 110a is so disposed that a center axis 1 of the microlens 101 is shifted relative to a center axis 2 of the ranging pixel 110a. Specifically, the center axis 1 of the microlens 101 is shifted in the +X-direction relative to the center axis 2 of the ranging pixel 110a. Here, the center axis 1 of the microlens 101 corresponds to the optical axis of the microlens 101. In addition, the center axis 2 of the ranging pixel 110a corresponds to a line that passes through the center of the ranging pixel 110a and that is parallel to the Z-axis. Hereinafter, a direction in which the center axis 1 of the microlens 101 is shifted relative to the center axis 2 of the ranging pixel 110a is referred to as a shift direction of the microlenses 101. It is to be noted that the microlenses 101 are so disposed that their center axes 1 are shifted relative to the respective center axes 2 of the ranging pixels 110a located in the peripheral region 100a of the solid-state image sensor 100 in order to achieve the same purpose as the one described in Japanese Patent Laid-Open No. 2010-182765.

The shift direction of the microlens 101 is expressed as a vector along a light-incident face of the substrate 121 that is directed toward an intersection of the light-incident face of the substrate 121 and the center axis 1 of the microlens 101 from the center of the ranging pixel 110a. The waveguide 103 is so disposed that the direction of a vector obtained by projecting the vector representing the shift direction of the microlens 101 onto a straight line connecting the centers of the waveguide 103 and the waveguide 102 is opposite to the direction of a vector that is directed toward the center of the waveguide 103 from the center of the ranging pixel 110a. In other words, a first waveguide is disposed on a side of the center axis of the ranging pixel that is in a direction opposite to a direction obtained by projecting the shift direction of the microlens onto the straight line connecting the center of the first waveguide and the center of a second waveguide. In addition, the waveguide 102 is so disposed that the direction of the vector obtained by projecting the vector representing the shift direction of the microlens 101 onto the straight line connecting the center of the waveguide 103 and the center of the waveguide 102 is in a direction identical to the direction of a vector that is directed toward the center of the waveguide 102 from the center of the ranging pixel 110a. In other words, the second waveguide is disposed on another side of the center axis of the ranging pixel that is in a direction identical to a direction obtained by projecting the shift direction of the microlens onto the straight line.

Here, the center of the waveguide 102 corresponds to a centroid of the shape of an end face of a core 104 at the side of the photoelectric conversion unit 122 as viewed along the XY-plane. Hereinafter, a direction represented by the vector obtained by projecting the vector representing the shift direction of the microlens 101 onto the straight line connecting the centers of the two waveguides 102 and 103 is referred to as a projection shift direction of the microlens 101. It is to be noted that axes 3 and 4 illustrated in FIG. 2A are, respectively, an axis that is parallel to the Z-axis and that passes through the center of the waveguide 103 and an axis that is parallel to the Z-axis and that passes through the center of the waveguide 102.

The waveguide 102 is formed by the core 104 and a clad 106, and guides a portion of the light from the microlens 101 to the photoelectric conversion unit 122 through primarily the core 104 that propagates the light. Meanwhile, the waveguide 103 is formed by a core 105 and a clad 107, and guides another portion of the light from the microlens 101 to the photoelectric conversion unit 123 through primarily the core 105 that propagates the light.

In the present exemplary embodiment, the cross-sectional area of the core 105 in the waveguide 103 is greater than the cross-sectional area of the core 104 in the waveguide 102. More specifically, as illustrated in FIG. 2B, the width of the core 105 in the waveguide 103 is greater than the width of the core 104 in the waveguide 102 in the shift direction (+X-direction) of the microlens 101. Meanwhile, the width of the core 104 in the waveguide 102 is equal to the width of the core 105 in the waveguide 103 in the direction (Y-direction) orthogonal to the shift direction of the microlens 101 along a plane of the substrate 121.

Here, the cross-sectional area of a core corresponds to an average of the area of an end face (region enclosed by a clad) of the core that is located at the side of the microlens and the area of an end face (region enclosed by the clad) of the core that is located at the side of the photoelectric conversion unit. Meanwhile, the width of the core corresponds to an average of the width of the end face of the core that is located at the side of the microlens and the width of the end face of the core that is located at the side of the photoelectric conversion unit.

Although not illustrated, in the ranging pixel 110b, as in the ranging pixel 110a, the microlens is so disposed that its center axis is shifted relative to the center axis of the ranging pixel 110b. Specifically, the center axis of the microlens in the ranging pixel 110b is shifted in the −X-direction relative to the center axis of the ranging pixel 110b, as opposed to the shift direction of the microlens 101 in the ranging pixel 110a. In addition, in the ranging pixel 110b as well, the cross-sectional area of a core in a waveguide having a center position that is farther from the center axis of the microlens is greater than the cross-sectional area of a core in a waveguide having a center position that is closer to the center of the microlens.

Configuring the ranging pixels 110a and 110b as described above makes it possible to measure the distance with high accuracy even in the peripheral regions 100a and 100b of the solid-state image sensor 100. Hereinafter, reasons therefor will be described while the above-described configuration is compared with a configuration in which the cross-sectional areas of cores in a plurality of waveguides provided in a given ranging pixel are equal to each other.

Figure 14A:
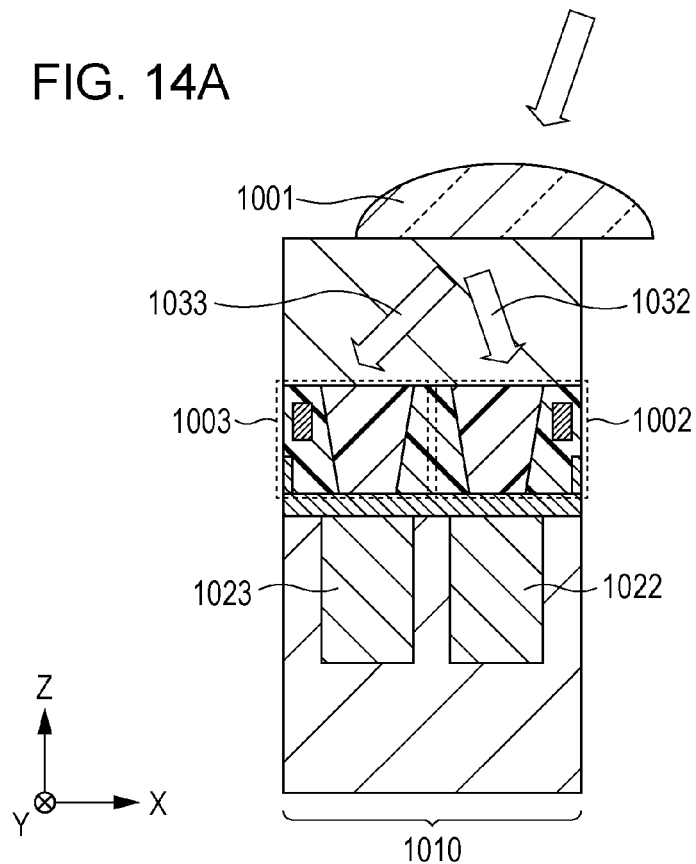
FIG. 14A is a schematic diagram illustrating a ranging pixel according to a comparative example.

FIG. 14A is a schematic diagram illustrating a ranging pixel 1010 according to a comparative example. The ranging pixel 1010 includes a microlens 1001, a plurality of waveguides 1002 and 1003, and a plurality of photoelectric conversion units 1022 and 1023 disposed from the light-incident side. Specifically, the center axis of the microlens 1001 is shifted in the +X-direction relative to the center axis of the ranging pixel 1010. The waveguide 1003 is disposed on a side of the center axis of the ranging pixel 1010 that is in a direction opposite to the projection shift direction of the microlens 1001. Meanwhile, the waveguide 1002 is disposed on another side of the center axis of the ranging pixel 1010 that is in a direction identical to the projection shift direction of the microlens 1001. Here, unlike the ranging pixel 110a described above, the cross-sectional area of the core in the waveguide 1002 is equal to the cross-sectional area of the core in the waveguide 1003. The photoelectric conversion units 1022 and 1023 are so formed that their sizes are substantially equal to each other. The arrows illustrated in FIG. 14A indicate how the light beams propagate, which will be described later.

Figure 14B:
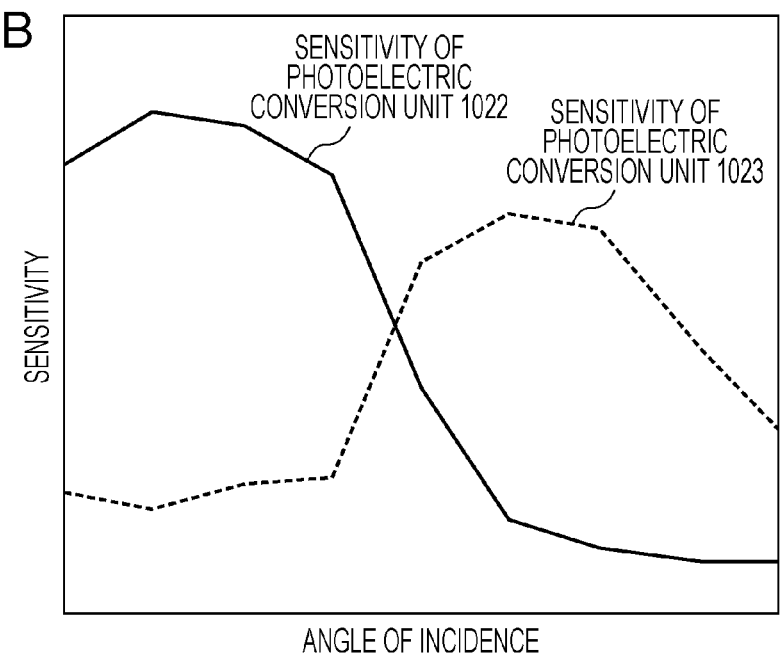
FIG. 14B is a schematic diagram illustrating the sensitivity of the ranging pixel according to the comparative example.

FIG. 14B illustrates the sensitivity behavior of the ranging pixel 1010. As can be seen from FIG. 14B, the maximum value of the sensitivity of the photoelectric conversion unit 1023 is smaller than the maximum value of the sensitivity of the photoelectric conversion unit 1022. As a result, a difference is generated between the intensity of the electric signal obtained by the photoelectric conversion unit 1022 and the intensity of the electric signal obtained by the photoelectric conversion unit 1023. When there is a difference between the intensities of the electric signals, an error in reading the positional shift amount of the ranging images increases, and thus the accuracy in measuring the distance decreases.

Subsequently, what causes a situation in which the sensitivity of the photoelectric conversion unit 1023 is lower than the sensitivity of the photoelectric conversion unit 1022 will be described. FIG. 14A illustrates the propagation of the light beams (indicated by the arrows) in a case in which the center of the microlens 1001 is shifted relative to the center of the ranging pixel 1010. As illustrated in FIG. 14A, a portion of the light beams incident on the microlens 1001 turns into a light beam 1033 that enters the waveguide 1003 located in the direction (−X-direction) opposite to the shift direction (+X-direction) of the microlens 1001. In addition, another portion of the light beams incident on the microlens 1001 turns into a light beam 1032 that enters the waveguide 1002 located in a direction (+X-direction) identical to the shift direction of the microlens 1001. The angle of incidence of the light beam 1033 entering the waveguide 1003 is greater than the angle of incidence of the light beam 1032 entering the waveguide 1002.

Typically, as the angle of incidence of a light beam entering a waveguide is greater, the light beam is more likely to couple with a higher guided mode of the waveguide than with a lower guided mode of the waveguide. However, a waveguide only has a limited number of orders of guided modes, and thus as the angle of incidence of a light beam entering the waveguide is larger, the coupling efficiency between the light beam and the waveguide is reduced. Therefore, the sensitivity of the photoelectric conversion unit 1023 corresponding to the waveguide 1003 becomes lower than the sensitivity of the photoelectric conversion unit 1022 corresponding to the waveguide 1002.

Such a difference in the sensitivity presents a larger problem in the ranging pixel 1010 in a peripheral region of a solid-state image sensor as the difference between the angles of incidence increases due to the microlens 1001 being shifted. As a result, the sensitivity of the photoelectric conversion unit 1023 is greatly reduced than the sensitivity of the photoelectric conversion unit 1022, which leads to a decrease in the accuracy in measuring the distance in the peripheral region.

On the other hand, the ranging pixel 110a (110b) disposed in the peripheral region 100a (110b) of the solid-state image sensor 100 according to the present exemplary embodiment has the above-described configuration as illustrated in FIGS. 2A and 2B. Specifically, the cross-sectional area of the core 105 in the waveguide 103 which an incident light beam enters at a larger angle is greater than the cross-sectional area of the core 104 in the waveguide 102 which an incident light beam enters at a smaller angle.

Typically, when the product of the cross-sectional area of a core and the square root of the difference between the refractive indices of the core and a clad is large, the waveguide has a higher guided mode. Therefore, with the above-described configuration, the waveguide 103 has a guided mode that is in the higher order than the guided mode of the waveguide 102. Thus, even if the angle of incidence of the light beam entering the waveguide 103 is larger, the decrease in the coupling efficiency between the light beam and the waveguide 103 can be suppressed since the waveguide 103 also has a higher guided mode.

Figure 3A:
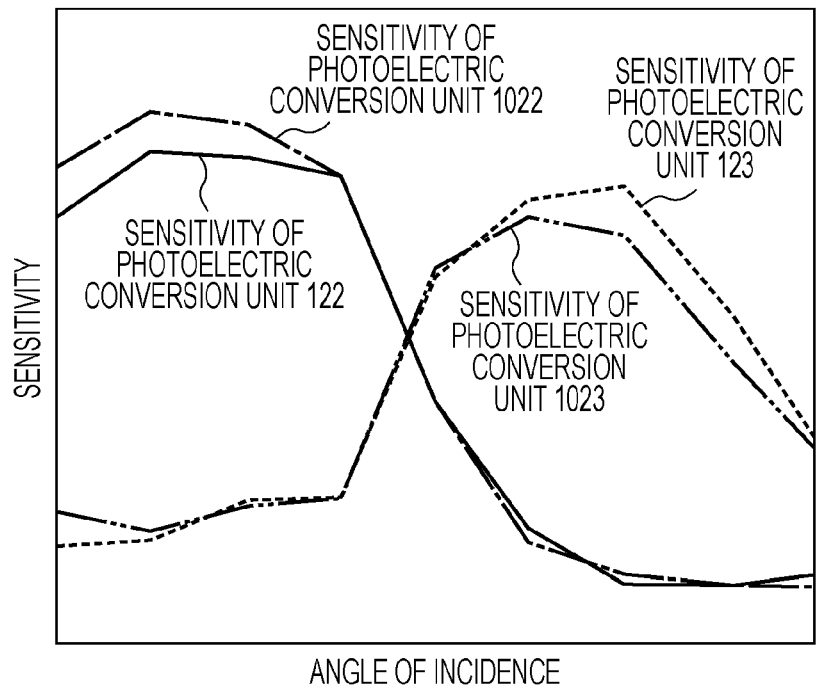
FIGS. 3A and 3B are schematic diagrams indicating the pixel sensitivity of the ranging pixel according to the first exemplary embodiment.

FIG. 3A illustrates the sensitivity behavior of the ranging pixel 110a according to the present exemplary embodiment. It is to be noted that the sensitivity behavior of the ranging pixel 1010 illustrated in FIG. 14B is also illustrated in FIG. 3A for comparison. The solid line indicates the sensitivity behavior of the photoelectric conversion unit 122 disposed in the ranging pixel 110a. The broken line indicates the sensitivity behavior of the photoelectric conversion unit 123 disposed in the ranging pixel 110a. The dashed-dotted line indicates the sensitivity behavior of the photoelectric conversion unit 1022 disposed in the ranging pixel 1010. The dashed-two-dotted line indicates the sensitivity behavior of the photoelectric conversion unit 1023 disposed in the ranging pixel 1010.

As illustrated in FIG. 3A, the difference between the maximum sensitivities of the photoelectric conversion units 122 and 123 disposed in the ranging pixel 110a is smaller than the difference between the maximum sensitivities of the photoelectric conversion units 1022 and 1023 disposed in the ranging pixel 1010. As a result, the difference between the intensity of the electric signal obtained by the photoelectric conversion unit 122 and the intensity of the electric signal obtained by the photoelectric conversion unit 123 is reduced, and the accuracy in reading the positional shift amount of the images improves, making it possible to improve the accuracy in measuring the distance.

The cores 104 and 105 and the clads 106 and 107 forming the waveguides 102 and 103 can be made of an inorganic substance, such as silicon oxide, silicon nitride, silicon oxynitride, silicon carbide, and BPSG, or an organic substance, such as a polymer and a resin. It is to be noted that the combination of the substances is so selected that the refractive index of the core 104 is greater than the refractive index of the clad 106 and the refractive index of the core 105 is greater than the refractive index of the clad 107. In the present exemplary embodiment, the core 104 and the core 105 are made of the same material, and the clad 106 and the clad 107 are made of the same material. Here, the refractive indices are compared in terms of the refractive indices at a wavelength (e.g., 530 nm for a green pixel of a solid-state image sensor for a digital camera) of a light beam incident on a ranging pixel. In addition, the wires 108 are provided in the clads 106 and 107 for transferring electric charges generated by the photoelectric conversion units 122 and 123 to a signal processing circuit.

The photoelectric conversion units 122 and 123 are formed by providing potential gradient through ion implantation or the like on the substrate 121 that is formed by a material, such as silicon, having absorbing properties in a detection wavelength band. The photoelectric conversion units 122 and 123 each have a function of converting light to an electric charge. In addition, a gettering layer 109 is formed between the waveguides 102 and 103 and the photoelectric conversion units 122 and 123 for preventing the incident light from being reflected and for preventing the photoelectric conversion units 122 and 123 from being contaminated. As the gettering layer 109, a layer formed by any one of BPSG, $SiO_2$, and SiN, or a layer obtained by stacking BPSG, $SiO_2$, and SiN may be used.

The microlens 101 is made of a material, such as silicon oxide and an organic substance, that is transparent in the detection wavelength band, and is disposed across the photoelectric conversion units 122 and 123. A material being transparent herein means that the transmittance of the material to the light in the detection wavelength band is 80% or higher, or preferably 99% or higher. The ranging pixels 110a are in 1-to-1 correspondence with the microlenses 101. Specifically, the microlens 101 is so disposed that its focal position lies inside the waveguide 102 or 103 provided in the ranging pixel 110a. As long as such a condition is satisfied, the microlens 101 may partially overlap an adjacent pixel. An underlying layer 130 is formed between the microlens 101 and the waveguides 102 and 103. The underlying layer 130 may include a color filter.

Modifications

Figure 4A:
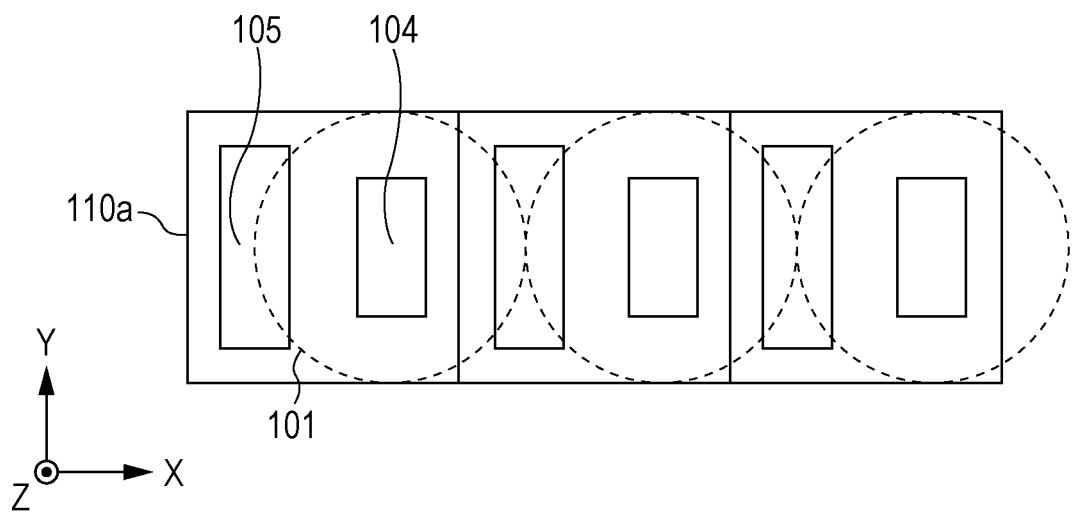
FIGS. 4A and 4B are schematic diagrams illustrating another example of ranging pixels according to the first exemplary embodiment.
Figure 4B:
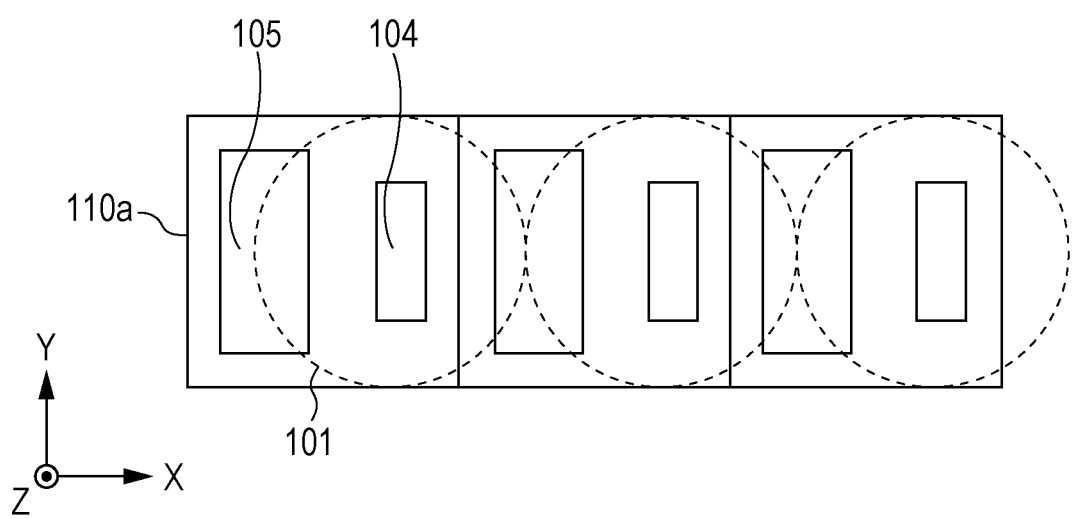

Although the widths of the cores 104 and 105 in the X-direction are set to be different from each other in order to set the cross-sectional area of the core 104 in the waveguide 102 to be different from the cross-sectional area of the core 105 in the waveguide 103 in the configuration illustrated in FIGS. 2A and 2B, the exemplary embodiment is not limited to such a configuration. Alternatively, only the widths of the cores 104 and 105 in the Y-direction may be different from each other as illustrated in FIG. 4A, or the widths of the cores 104 and 105 in both the X-direction and the Y-direction may be different from each other as illustrated in FIG. 4B. However, in the light of symmetry in the wiring layout, it is preferable that the widths of the cores 104 and 105 be different only in a direction (X-direction in the case of the configuration illustrated in FIGS. 2A and 2B) in which the waveguides 102 and 103 are arrayed in the ranging pixel 110a. The section of each of the cores 104 and 105 along the XY-plane may be polygonal, such as a rectangle as illustrated in FIGS. 2A, 4A, and 4B, or may be circular or elliptical.

The angle of incidence of a principal ray incident on a pixel is greater in a pixel that is further spaced apart from the center of the solid-state image sensor 100. In particular, the angle of incidence is larger in a region that is spaced apart from the center of the solid-state image sensor 100 by a distance that is no less than 0.25 times the length of the diagonal line of the solid-state image sensor 100, and the angle of incidence is even larger in a region that is spaced apart from the center of the solid-state image sensor 100 by a distance that is no less than 0.4 times the length of the diagonal line. Accordingly, the difference between the angles of incidence of the light beams entering the different waveguides within a given ranging pixel becomes larger in the aforementioned region, and thus the difference between the coupling efficiencies of the light beams and the waveguides becomes larger, which aggravates the aforementioned problem. Therefore, in the present exemplary embodiment, regions that are spaced apart from the center of the solid-state image sensor 100 by a distance that is no less than 0.4 times the length of the diagonal line of the solid-state image sensor 100 are designated as the peripheral regions 100*a* and 100*b*, and the ranging pixels located in the peripheral regions 100*a* and 100*b* are configured as the ranging pixels having the above-described configuration. Furthermore, it is preferable that ranging pixels located in a region that is spaced apart from the center of the solid-state image sensor 100 by a distance that is no less than 0.25 times the length of the diagonal line of the solid-state image sensor 100 be also configured as the ranging pixels having the above-described configuration.

As described above, the angle of incidence of a principal ray incident on a pixel is greater in a pixel that is further spaced apart from the center of the solid-state image sensor. Therefore, it is preferable that the shift amount of a microlens relative to the center axis of the ranging pixel be greater in a ranging pixel that is further spaced apart from the center of the solid-state image sensor. In other words, of two ranging pixels, it is preferable that the shift amount of the microlens provided in one of the ranging pixels that is farther from the center of the solid-state image sensor be greater than the shift amount of the microlens provided in the other ranging pixel that is closer to the center of the solid-state image sensor. Such a configuration brings about an effect that a variation in the sensitivity among pixels within the solid-state image sensor is suppressed. It is to be noted that, of the two ranging pixels, the distance between the centroid of the ranging pixel and the center of the solid-state image sensor is greater for the ranging pixel that is located farther from the center of the solid-state image sensor than for the ranging pixel that is located closer to the center of the solid-state image sensor.

In each of the ranging pixels 110*a*, the waveguides 102 and 103 are arrayed in the projection shift direction of the microlens 101, and thus as the shift amount of the microlens 101 in the projection shift direction is greater, the difference between the coupling efficiencies of the respective waveguides 102 and 103 to the light beams in a given ranging pixel becomes larger. Therefore, as the shift amount of the microlens 101 in the projection shift direction thereof is greater, it is preferable that the difference between the cross-sectional area of the core 104 in the waveguide 102 and the cross-sectional area of the core 105 in the waveguide 103 be set greater.

Figure 5A:
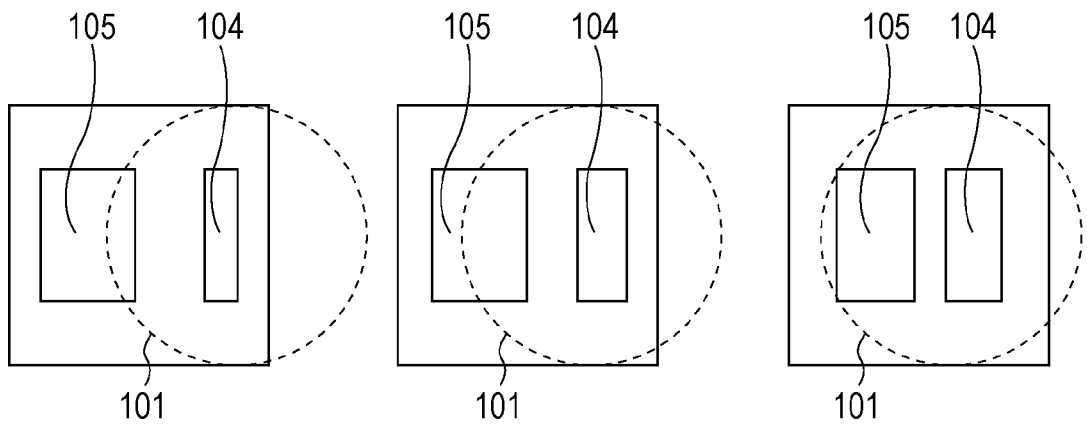
FIGS. 5A and 5B are schematic diagrams illustrating yet another example of ranging pixels according to the first exemplary embodiment.

An example of such a configuration is illustrated in FIG. 5A. FIG. 5A illustrates the three ranging pixels 110*a* located in a region enclosed by the dashed-dotted line in FIG. 1. It is to be noted that FIG. 5A illustrates the ranging pixels 110*a* in a state in which they are spaced apart from one another. In addition, the order in which the three ranging pixels 110*a* are disposed in FIG. 5A is the same as the order in which the three ranging pixels 110*a* are disposed in the region enclosed by the dashed-dotted line in FIG. 1. The ranging pixel 110*a* disposed at the leftmost side is the ranging pixel 110*a* that is farthest from the center of the solid-state image sensor 100 among the three ranging pixels 110*a*, and the ranging pixel 110*a* disposed at the rightmost side is the ranging pixel 110*a* that is closest to the center of the solid-state image sensor 100 among the three ranging pixels 110*a*. Accordingly, the shift amount of the microlens 101 is greater as the ranging pixel 110*a* is located closer to the left side, and the difference between the cross-sectional area of the core 104 and the cross-sectional area of the core 105 is greater. In this manner, as the cross-sectional areas of the cores 104 and 105 in the waveguides 102 and 103 are varied in accordance with the shift amount of the microlens 101, the difference between the sensitivities of the photoelectric conversion units 122 and 123 is reduced regardless of the shift amount of the microlens 101. Thus, the accuracy in measuring the distance can be improved.

Although an example in which the cross-sectional areas of the core 104 and the core 105 are both varied in accordance with the shift amount of the microlens 101 is illustrated in FIG. 5A, only the cross-sectional area of the core 104 or the cross-sectional area of the core 105 may be varied. However, it is preferable that the difference between the cross-sectional areas of the cores 104 and 105 in each of the ranging pixels 110*a* be so varied that the sum of the cross-sectional areas of the cores 104 and 105 is constant among different ranging pixels 110*a* in order to improve the utilization efficiency of light incident on the ranging pixels 110*a*.

Figure 5B:
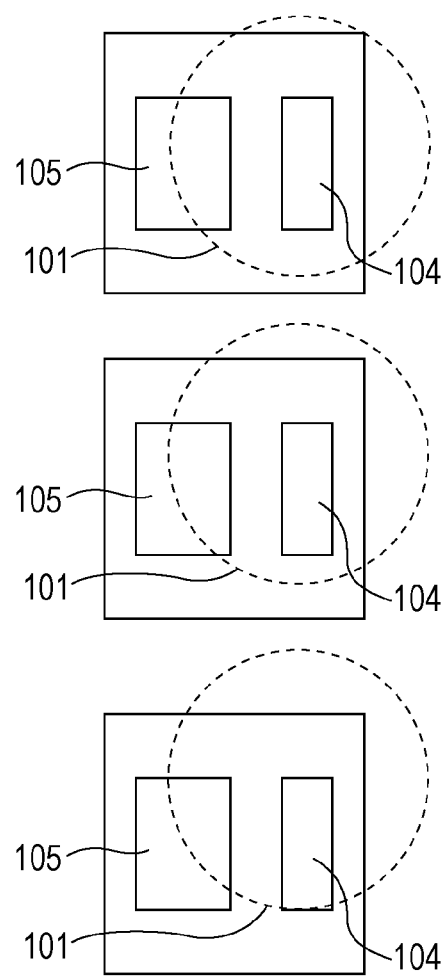

In addition, the shift direction of the microlens 101 does not have to be the X-direction, and the microlens 101 may be shifted at an angle relative to the X-direction. Light beams incident on the pixels located in the peripheral regions 100*a* and 100*b* of the solid-state image sensor 100 are inclined toward the center of the solid-state image sensor 100, and thus it is preferable that the microlens 101 be shifted toward the center of the solid-state image sensor 100 at an angle relative to the X-direction, so that the light beams can be received with high efficiency. An example of such a configuration is illustrated in FIG. 5B. FIG. 5B illustrates the three ranging pixels 110*a* located in a region enclosed by the dashed-two-dotted line in FIG. 1. It is to be noted that FIG. 5B illustrates the ranging pixels 110*a* in a state in which they are spaced apart from one another. In this manner, the shift direction of the microlens 101 disposed in the ranging pixel 110*a* may be varied in accordance with the disposed position of the ranging pixel 110*a*.

Even in a case in which the shift direction of the microlens 101 is at an angle relative to the X-direction, the angle of incidence of the light beam entering the waveguide 103 is greater than the angle of incidence of the light beam entering the waveguide 102. Therefore, as the cross-sectional area of the core 105 in the waveguide 103 is set to be greater than the cross-sectional area of the core 104 in the waveguide 102, the difference between the sensitivities of the plurality of photoelectric conversion units 122 and 123 can be suppressed, and the accuracy in measuring the distance is improved.

The angle of incidence of a principal ray incident on a pixel is small in a central region of the solid-state image sensor 100. Specifically, the angle of incidence of a principal ray is small in a central region that is closer to the center of the solid-state image sensor 100 than a position located at a distance of less than 0.25 times the length of the diagonal line of the solid-state image sensor 100 from the center of the solid-state image sensor 100, and thus a problem rarely arises. Therefore, in a case in which a ranging pixel is disposed in the aforementioned central region, the center axis of the microlens does not need to be shifted relative to the center axis of the ranging pixel.

In addition, in a ranging pixel located in a peripheral region of the solid-state image sensor 100 in the Y-direction, a principal ray incident on the ranging pixel is inclined in the Y-direction, and thus it is preferable that the microlens be shifted in the Y-direction.

In this manner, in a case in which the center axis of the microlens 101 is not shifted relative to the center axis of the ranging pixel 110a in the X-direction, which is the direction in which the waveguides 102 and 103 are arrayed, the angles of incidence of the principal rays that couple with the respective waveguides 102 and 103 become equal to each other. Therefore, it is preferable that the number of modes of the waveguide 102 and the waveguide 103 be equal to each other. In other words, in a case in which the microlens 101 is not shifted or the shift direction of the microlens 101 is orthogonal to the direction in which the plurality of waveguides 102 and 103 are arrayed, it is preferable that the cross-sectional areas of the cores 104 and 105 in the plurality of waveguides 102 and 103 be equal to each other and that the differences between the refractive indices of the cores 104 and 105 and the respective clads 106 and 107 be equal to each other.

The entire pixels provided in the solid-state image sensor 100 may be the ranging pixels 110. Alternatively, some of the pixels may be the ranging pixels 110, and the rest of the pixels may be normal image-capturing pixels. In a case in which the entire pixels are the ranging pixels 110, a captured image can be obtained by obtaining the sum of the electric signals obtained by the plurality of photoelectric conversion units. It is to be noted that a single photoelectric conversion unit, a single waveguide including a core and a clad disposed on the single photoelectric conversion unit, and a microlens disposed on the single waveguide are provided in each image-capturing pixel.

Figure 3B:
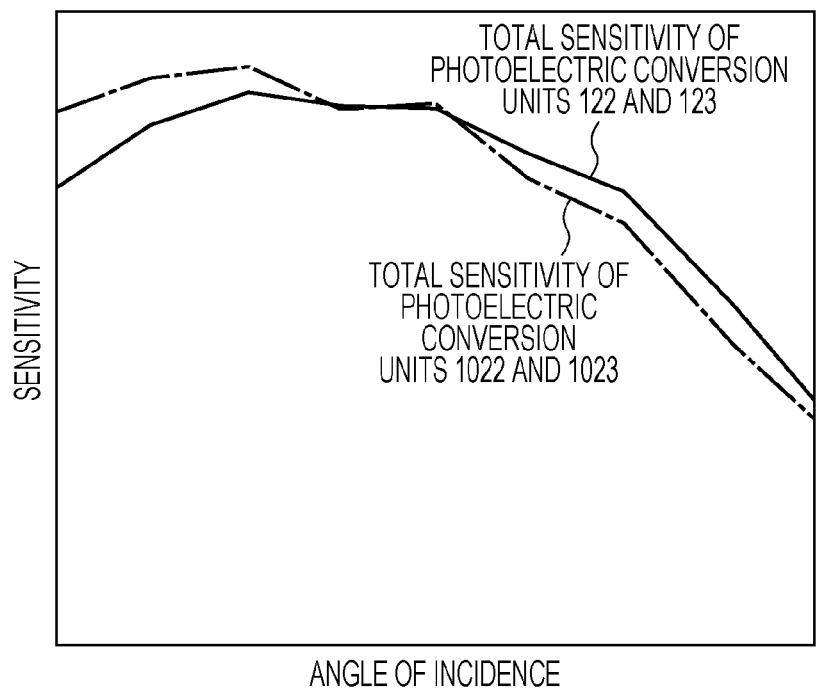

FIG. 3B illustrates the sum of the sensitivities of the photoelectric conversion units 122 and 123 in the ranging pixel 110a according to the present exemplary embodiment in comparison with the sum of the sensitivities of the photoelectric conversion units 1022 and 1023 in the ranging pixel 1010 according to the comparative example illustrated in FIGS. 14A and 14B. As illustrated in FIG. 3B, the sum of the sensitivities of the photoelectric conversion units 122 and 123 according to the present exemplary embodiment exhibits the angular characteristics that are close to being flat than the sum of the sensitivities of the photoelectric conversion units 1022 and 1023 according to the comparative example. Therefore, in a case in which a captured image is obtained from a ranging pixel, angular dependence among pixels can be reduced, and thus the quality of the captured image can be improved.

In a case in which some of the pixels in the solid-state image sensor 100 are the ranging pixels 110a, images captured by the ranging pixels 110a may be obtained through the method described above, or may be obtained by complementing the aforementioned images by captured images obtained by the normal image-capturing pixels provided around the ranging pixels 110a. It is preferable that the microlenses be shifted toward the center of the solid-state image sensor 100 even in the image-capturing pixels located in the peripheral regions 100a and 100b, in order to improve the quality of the captured images.

Second Exemplary Embodiment

Figure 6A:
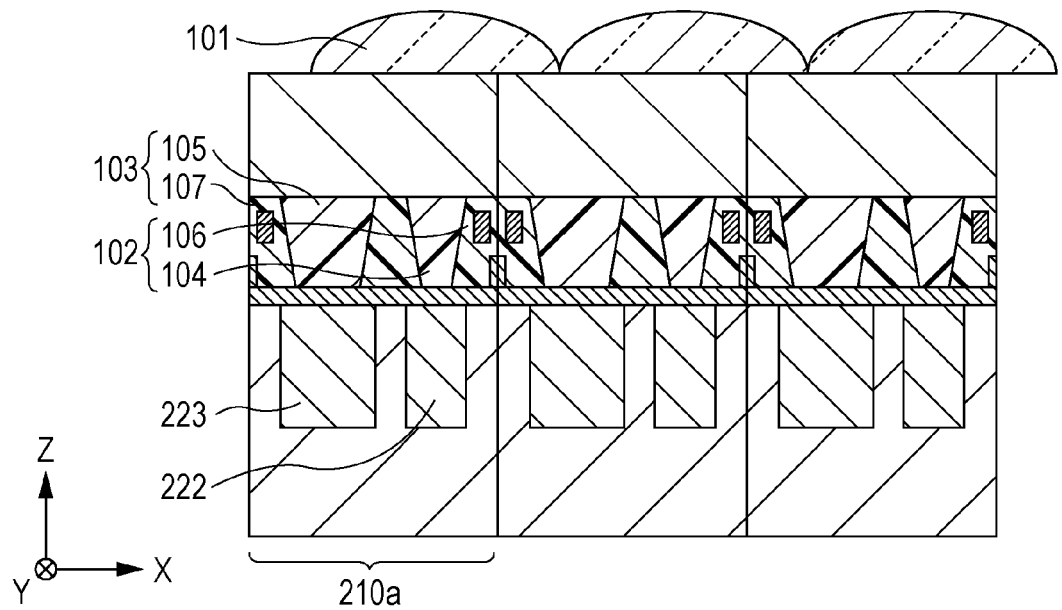
FIG. 6A is a schematic diagram illustrating an example of ranging pixels according to a second exemplary embodiment.

FIG. 6A is a schematic diagram illustrating components disposed in a ranging pixel 210a according to the present exemplary embodiment, and the ranging pixel 210a is to be disposed in the peripheral region 100a of the solid-state image sensor 100 illustrated in FIG. 1. Photoelectric conversion units 222 and 223 disposed in the ranging pixel 210a illustrated in FIG. 6A differ from the photoelectric conversion units 122 and 123 disposed in the ranging pixel 110a according to the first exemplary embodiment in terms of their shapes. Specifically, the area of the photoelectric conversion unit 223 located on a side of the center axis of the ranging pixel 210a that is in a direction opposite to the projection shift direction of the microlens 101 is greater than the area of the photoelectric conversion unit 222 located on another side of the center axis of the ranging pixel 210a that is in a direction identical to the projection shift direction of the microlens 101. Here, the area of a photoelectric conversion unit corresponds to the area of an end face of the photoelectric conversion unit at the side of a waveguide.

With such a configuration, crosstalk between the plurality of photoelectric conversion units 222 and 223 in a given ranging pixel 210a can be suppressed. As a result, the dividing characteristics of an incident light beam in a ranging pixel 210a improves, and the performance in measuring the distance improves. Reasons therefor will be described hereinafter.

Figure 6B:
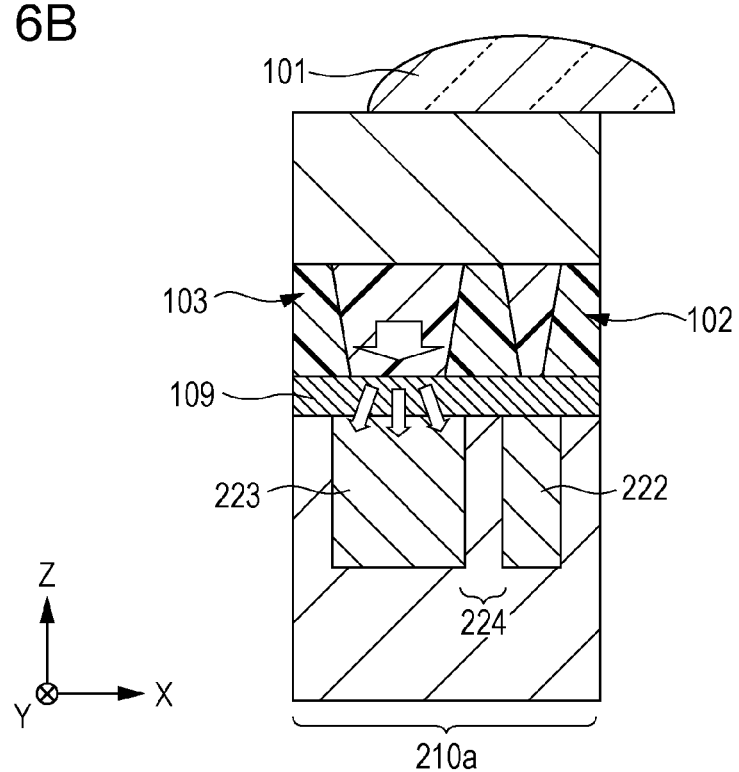
FIG. 6B is a schematic diagram illustrating propagation of a light beam in the ranging pixel according to the second exemplary embodiment.

FIG. 6B illustrates a light beam emitted from the waveguide 103 and incident on the photoelectric conversion unit 223. The waveguide 103 has a higher guided mode, and thus a light beam emitted from the waveguide 103 toward the photoelectric conversion unit 223 has a large divergence. Thus, while the divergence of this light beam is taken into consideration, the cross-sectional area of the photoelectric conversion unit 223 is set to be greater than the cross-sectional area of the photoelectric conversion unit 222 in the ranging pixel 210a according to the present exemplary embodiment. Therefore, the proportion of the light beam incident on a barrier region 224 between the photoelectric conversion units 222 and 223 to the light beam emitted from the waveguide 103 toward the photoelectric conversion unit 223 is reduced, and thus crosstalk can be suppressed.

It is preferable that the cross-sectional areas of the photoelectric conversion units 222 and 223 be so determined that the light beams emitted from the corresponding waveguides 102 and 103 couple with the respective photoelectric conversion units 222 and 223 with high efficiency. Specifically, it is preferable that the value representing the ratio of the area of the photoelectric conversion unit 223 to the area of the photoelectric conversion unit 222 be greater than the value representing the ratio of the cross-sectional area of the core 105 in the waveguide 103 to the cross-sectional area of the core 104 in the waveguide 102. This is because a larger portion of the light that has coupled with the waveguide 103 is in a higher guided mode than a portion of the light that has coupled with the waveguide 102, and thus the light emitted from the waveguide 103 has a larger divergence. As the ratio between the areas of the photoelectric conversion units 222 and 223 is set to be greater than the ratio between the cross-sectional areas of the cores 104 and 105 in the waveguides 102 and 103, the light beam having a large divergence emitted from the waveguide 103 can be detected with high efficiency. Accordingly, the difference between the sensitivities of the plurality of photoelectric conversion units 222 and 223 is reduced, and the accuracy in measuring the distance can be improved.

Third Exemplary Embodiment

Figure 7:
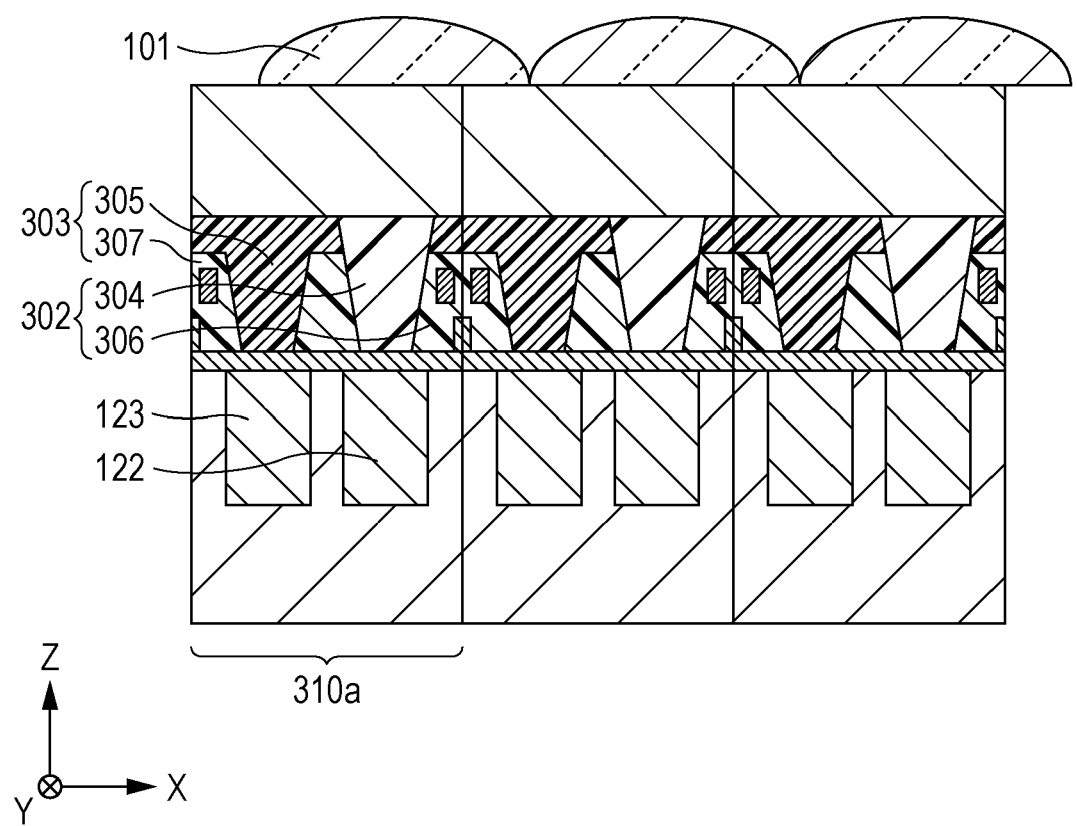
FIG. 7 is a schematic diagram illustrating an example of ranging pixels according to a third exemplary embodiment.

FIG. 7 illustrates a ranging pixel 310a according to the present exemplary embodiment, and the ranging pixel 310a is to be disposed in the peripheral region 100a of the solid-state image sensor 100 illustrated in FIG. 1. The ranging pixel 310a illustrated in FIG. 7 differs from the ranging pixel 110a according to the first exemplary embodiment in terms of the configuration of waveguides 302 and 303. In the ranging pixel 110a according to the first exemplary embodiment, the cross-sectional areas of the cores 104 and 105 are set to be different from each other. On the other hand, in the ranging pixel 310a according to the present exemplary embodiment, the differences between the refractive indices of the cores and the clads forming the respective waveguides 302 and 303 are set to be different from each other. Here, the refractive indices are compared in terms of the refractive indices at a wavelength of a light beam incident on a ranging pixel.

The waveguide 303 is disposed on a side of the center axis of the ranging pixel 310a that is in a direction opposite to the projection shift direction of the microlens 101. Meanwhile, the waveguide 302 is disposed on another side of the center axis of the ranging pixel 310a that is in a direction identical to the projection shift direction of the microlens 101. In the ranging pixel 310a according to the present exemplary embodiment, the difference between the refractive indices of a core 305 and a clad 307 in the waveguide 303 is set to be greater than the difference between the refractive indices of a core 304 and a clad 306 in the waveguide 302. More specifically, the clads 306 and 307 are formed of the same material, and the core 305 is formed of a material having a refractive index that is greater than a material of which the core 304 is formed.

Therefore, as described above, the waveguide 303 has a guided mode that is in the higher order than the guided mode of the waveguide 302, and thus the decrease in the coupling efficiency between the light beam and the waveguide 303 can be suppressed.

Figure 8:
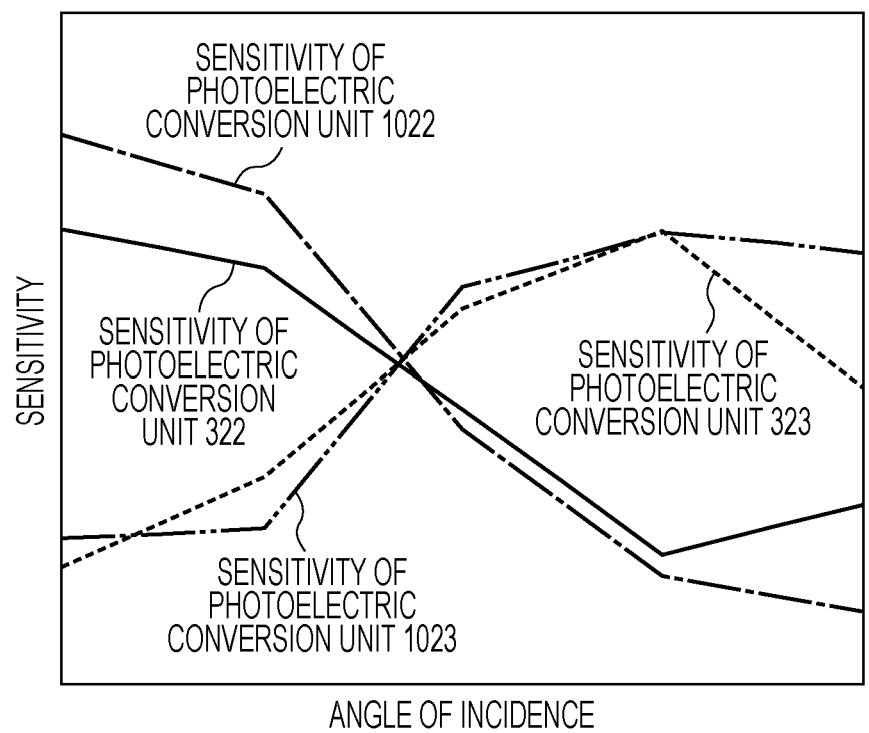
FIG. 8 is a schematic diagram indicating the pixel sensitivity of the ranging pixel according to the third exemplary embodiment.

FIG. 8 illustrates the sensitivity behavior of the ranging pixel 310a according to the present exemplary embodiment in comparison with the sensitivity behavior of the ranging pixel 1010 according to the comparative example illustrated in FIG. 14B. As can be seen from FIG. 8, as compared to the ranging pixel 1010, in the ranging pixel 310a, the difference between the maximum sensitivities of the two photoelectric conversion units 322 and 323 is reduced. As a result, the difference between the intensity of the electric signal obtained by the photoelectric conversion unit 322 and the intensity of the electric signal obtained by the photoelectric conversion unit 323 is reduced, and the accuracy in reading the positional shift amount of the images improves, making it possible to improve the accuracy in measuring the distance.

Manufacturing Method

Figure 9A:
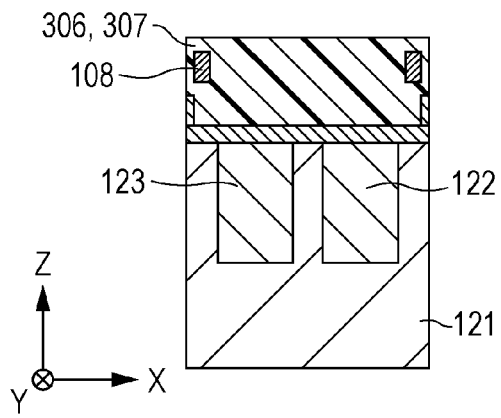
FIGS. 9A through 9E are schematic diagrams illustrating a method for manufacturing an example of the ranging pixel according to the third exemplary embodiment.
Figure 9B:
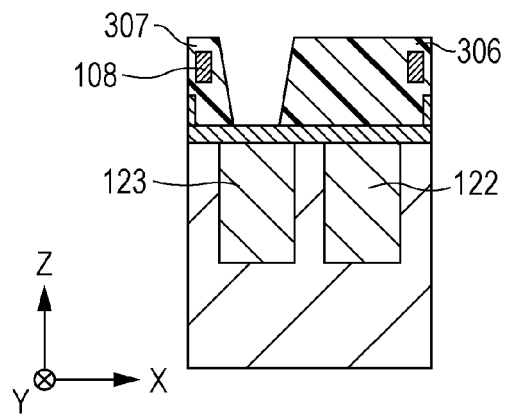
Figure 9C:
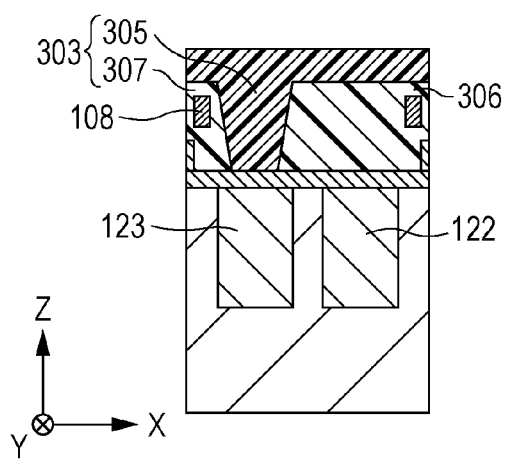
Figure 9D:
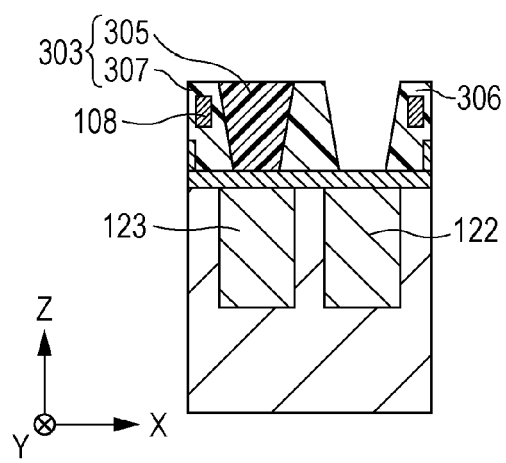
Figure 9E:
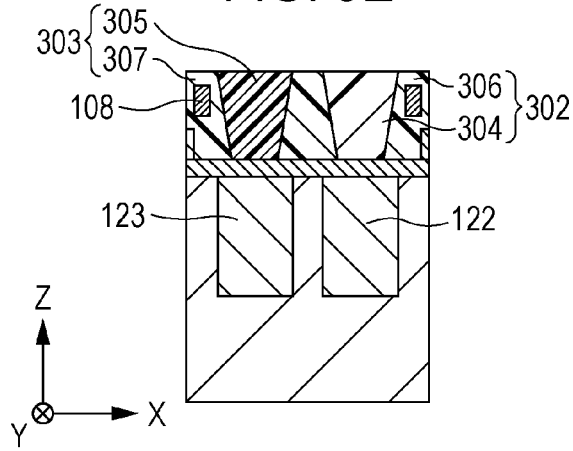

A manufacturing method described below may be employed in order to set the refractive index of the core 304 in the waveguide 302 to be different from the refractive index of the core 305 in the waveguide 303. First, the wires 108 are fabricated at locations above the substrate 121 through a damascene process, and a film is formed of a material that is to constitute the clads 306 and 307 (FIG. 9A). Subsequently, a portion that is to serve as the core 305 in the waveguide 303 is removed through lithography and dry-etching (FIG. 9B). A film is then formed of a material that is to constitute the core 305 so as to fabricate the waveguide 303 (FIG. 9C). Thereafter, a portion that is to serve as the core 304 in the waveguide 302 is removed through lithography and dry-etching (FIG. 9D). A film is then formed of a material that is to constitute the core 304 so as to fabricate the waveguide 302 (FIG. 9E).

In this manner, by carrying out a process of etching and implanting a waveguide twice, the waveguides 302 and 303 that have the cores 304 and 305 having different refractive indices can be manufactured. The order in which the waveguide 302 and the waveguide 303 are formed does not matter, and the order may be determined on the basis of the ease of implantation of a material that is to serve as a core. Typically, it is less easy to implant a material having a higher refractive index, and thus it is preferable that the waveguide 303 be formed first.

Although the difference between the refractive indices of a core and a clad is varied by setting the refractive indices of the cores 304 and 305 to be different from each other in the ranging pixel 310a illustrated in FIG. 7, the refractive indices of the clads 306 and 307 may be different from each other. Specifically, the core 304 and the core 305 may be formed of the same material, and the clad 307 may be formed of a material having a refractive index that is smaller than the refractive index of a material of which the clad 306 is formed. Alternatively, both the refractive indices of the cores 304 and 305 and the refractive indices of the clads 306 and 307 may be set to be different so as to achieve the above-described configuration of the ranging pixel 310a.

Figure 10A:
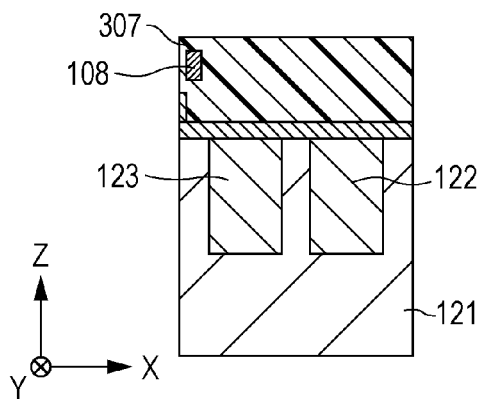
FIGS. 10A through 10F are schematic diagrams illustrating a method for manufacturing another example of the ranging pixel according to the third exemplary embodiment.
Figure 10B:
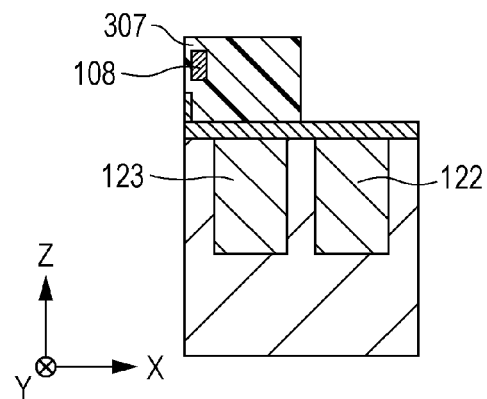
Figure 10C:
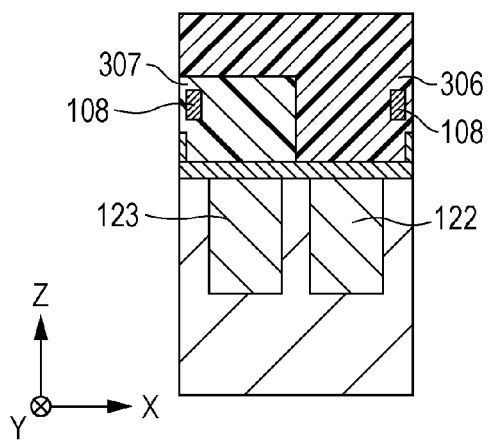
Figure 10D:
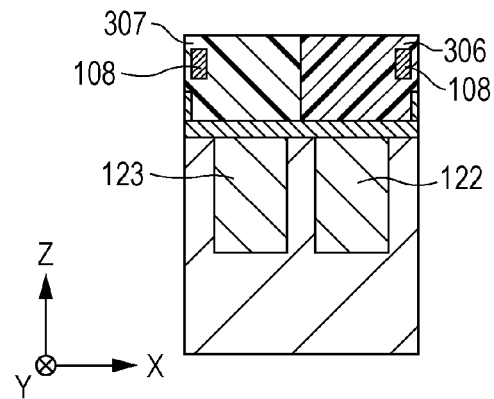
Figure 10E:
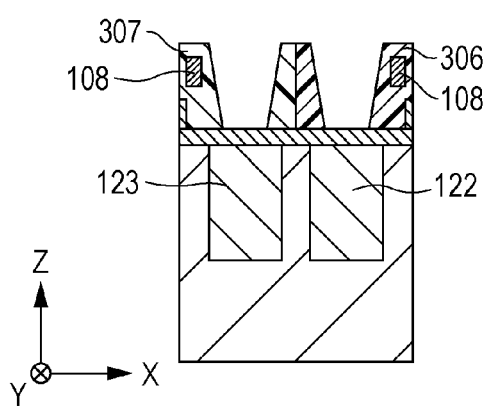
Figure 10F:
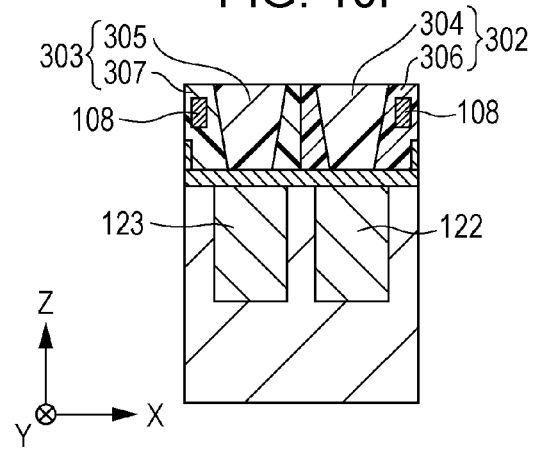

A manufacturing method described below may be employed in order to set the refractive indices of the clads 306 and 307 to be different from each other. First, a material that is to constitute the clad 307 is deposited and a wire 108 is fabricated at a location above the substrate 121 (FIG. 10A). Subsequently, a portion that is to serve as the waveguide 302 is removed through lithography and etching (FIG. 10B). Then, a material that is to constitute the clad 306 in the waveguide 302 is deposited and another wire 108 is fabricated (FIG. 10C). Thereafter, an unnecessary portion of the material that is to constitute the clad 306 deposited on a portion that is to serve as the waveguide 303 is removed through overall etching or the like (FIG. 10D). At this point, an etching mask used in the process illustrated in FIG. 10B may have been retained and be used as an etch-stop layer. Subsequently, portions that are to serve as the cores 304 and 305 in the waveguides 302 and 303 are removed through lithography and dry-etching (FIG. 10E). A material that is to constitute the core 304 in the waveguide 302 and a material that is to constitute the core 305 in the waveguide 303 are then implanted so as to fabricate the waveguides 302 and 303 (FIG. 10F).

In this manner, by carrying out a process of forming a clad twice, the waveguides 302 and 303 that have the clads 306 and 307 having different refractive indices can be manufactured. As in the process described with reference to FIGS. 9A through 9E, the order in which the waveguide 302 and the waveguide 303 are formed does not matter, and the order may be determined on the basis of the ease of overall etching in the process illustrated in FIG. 10D. Even in the solid-state image sensor according to the present exemplary embodiment, as in the solid-state image sensor 100 according to the first exemplary embodiment, as the shift amount of the microlens 101 is greater, the difference between the coupling efficiencies of the plurality of waveguides increases. Therefore, as the shift amount of the microlens 101 is greater, it is preferable that the difference between the difference between the refractive indices of the core 305 and the clad 307 in the waveguide 303 and the difference between the refractive indices of the core 304 and the clad 306 in the waveguide 302 be greater. In other words, it is preferable that the following relationship be satisfied. The value representing the ratio of the difference between the refractive indices in a waveguide located on a side that is in a direction opposite to the projection shift direction of the microlens to the difference between the refractive indices in another waveguide located on a side that is in a direction identical to the projection shift direction of the microlens is greater in a ranging pixel in which the shift amount of the microlens is greater than in a ranging pixel in which the shift amount is smaller.

In a similar manner, in a case in which the microlens is not shifted relative to the center of the ranging pixel in the direction (X-direction) in which the waveguides 302 and 303 are arrayed, it is preferable that the difference between the refractive indices of the core 304 and the clad 306 in the waveguide 302 be equal to the difference between the refractive indices of the core 305 and the clad 307 in the waveguide 303.

Fourth Exemplary Embodiment

In the ranging pixels in the solid-state image sensors according to the first through third exemplary embodiments, the plurality of waveguides are arrayed in the X-direction. In other words, a solid-state image sensor measures a distance by dividing a light beam incident on a ranging pixel in the X-direction and obtaining the divided light beam. However, the present invention may be applied to a solid-state image sensor that includes a ranging pixel that divides an incident light beam in a direction other than the X-direction.

Figure 11:
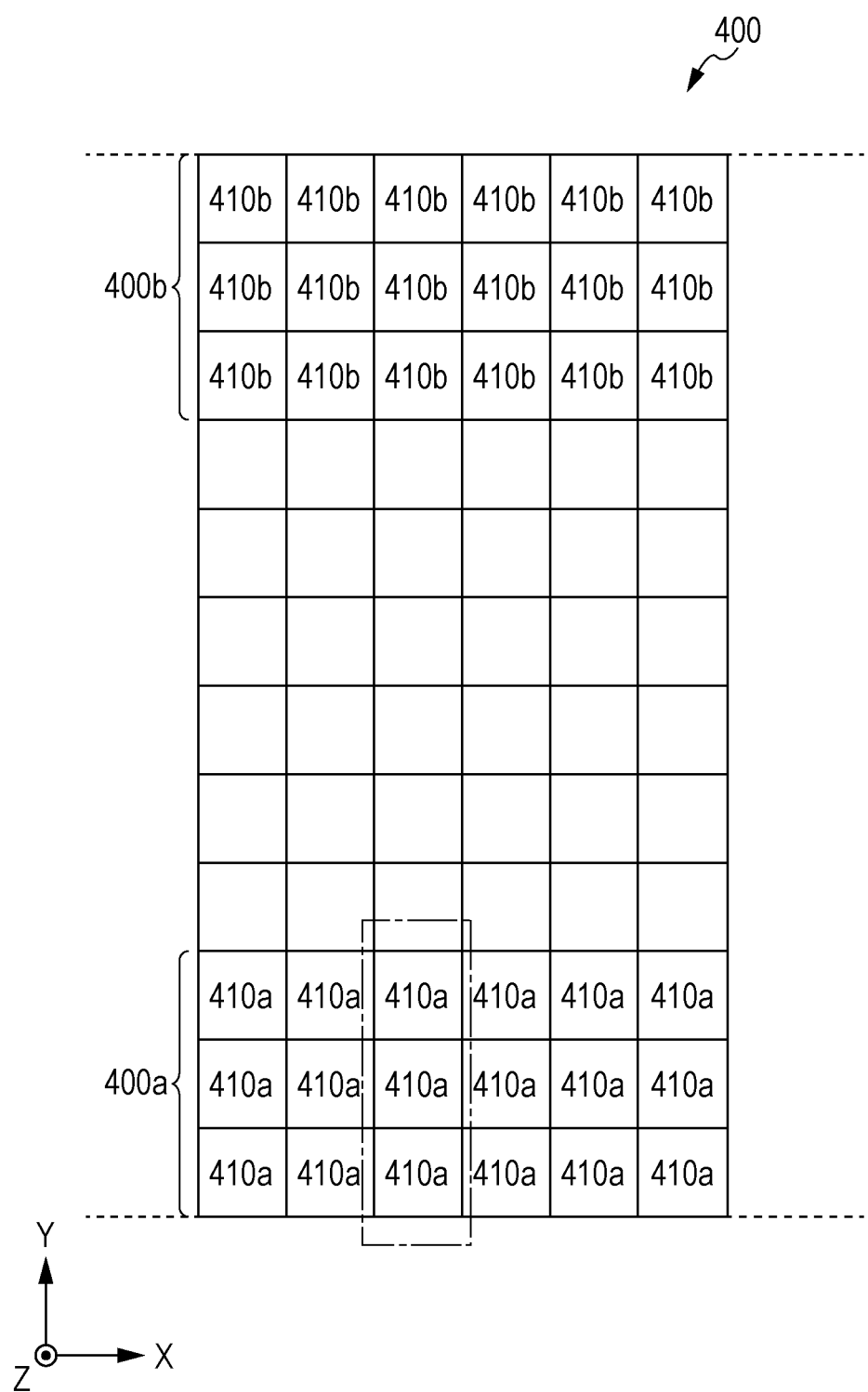
FIG. 11 is a schematic diagram illustrating an example of a solid-state image sensor according to a fourth exemplary embodiment.

FIG. 11 illustrates a portion of a solid-state image sensor 400 according to the present exemplary embodiment. It is to be noted that, in the present exemplary embodiment, as in the first exemplary embodiment, the X-direction corresponds to the lengthwise direction of the solid-state image sensor 400, and the Y-direction corresponds to the widthwise direction of the solid-state image sensor 400. In the solid-state image sensor 400, ranging pixels 410 that measure the distance by dividing an incident light beam in the Y-direction are disposed. Ranging pixels 410a are disposed in a peripheral region 400a of the solid-state image sensor 400 that is located in the −Y-direction. Meanwhile, ranging pixels 410b are disposed in a peripheral region 400b of the solid-state image sensor 400 that is located in the +Y-direction.

Figure 12A:
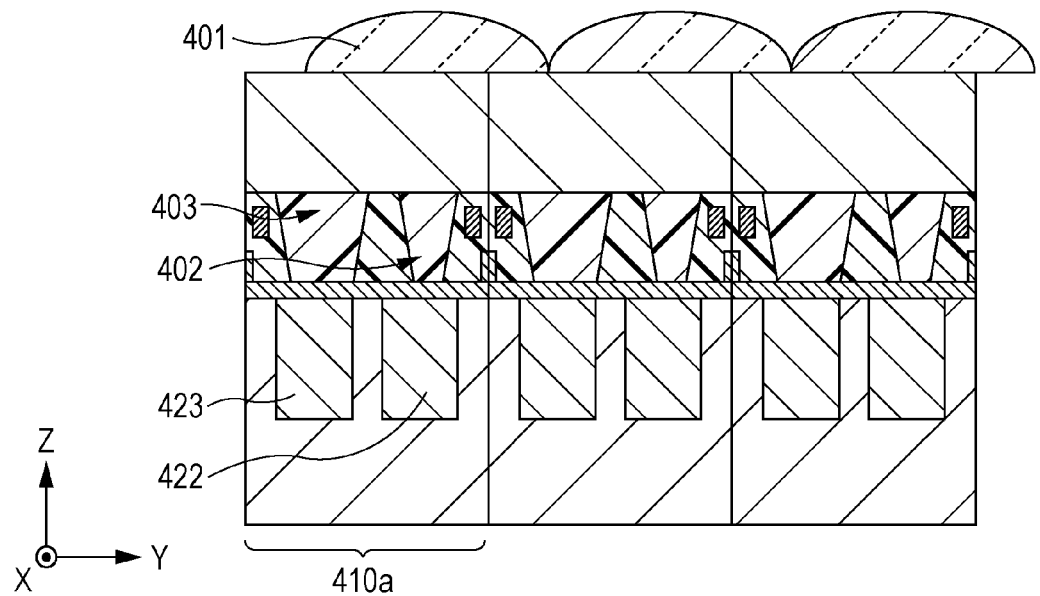
FIGS. 12A and 12B are schematic diagrams illustrating an example of ranging pixels according to the fourth exemplary embodiment.
Figure 12B:
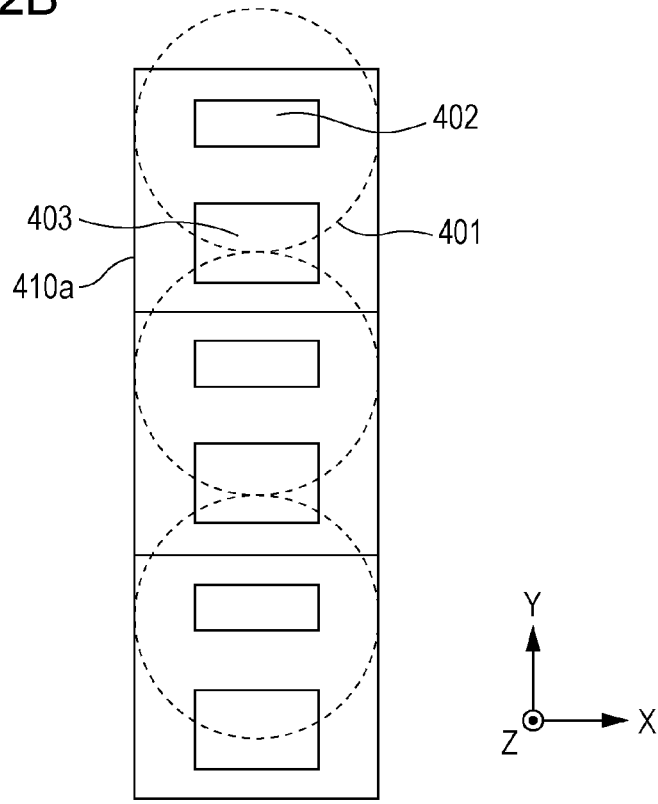

FIGS. 12A and 12B illustrate a layout of components disposed in the three ranging pixels 410a enclosed by the dashed-dotted line in FIG. 11. FIG. 12A is a schematic sectional view of the three ranging pixels 410a taken along the YZ-plane. The ranging pixels 410a each include a microlens 401, a plurality of waveguides 402 and 403, and a plurality of photoelectric conversion units 422 and 423 disposed from the light-incident side. The plurality of photoelectric conversion units 422 and 423 are so formed that their sizes are substantially equal to each other. FIG. 12B is a schematic plan view of the three ranging pixels 410a along the XY-plane.

The center axis of the microlens 401 is shifted in the direction (+Y-direction) toward the center of the solid-state image sensor 400 relative to the center axis of the ranging pixel 410a. In addition, the plurality of waveguides 402 and 403 and the plurality of photoelectric conversion units 422 and 423 are arrayed in the Y-direction. In the ranging pixel 410a, the waveguide 403 is disposed on a side of the center axis of the ranging pixel 410a that is in a direction opposite to the projection shift direction of the microlens 401. Meanwhile, the waveguide 402 is disposed on another side of the center axis of the ranging pixel 410a in a direction identical to the projection shift direction of the microlens 401. In addition, the width, in the Y-direction, of the core in the waveguide 403 disposed on the side that is in the direction (−Y-direction) opposite to the shift direction of the microlens 401 is greater than the width, in the Y-direction, of the core in the waveguide 402 disposed on the side that is in the direction (+Y-direction) identical to the shift direction of the microlens 401. In other words, the cross-sectional area of the core in the waveguide 403 is greater than the cross-sectional area of the core in the waveguide 402. With this configuration, as in the first exemplary embodiment, the difference between the maximum sensitivities of the photoelectric conversion units 422 and 423 can be reduced, and thus the accuracy in measuring the distance is improved.

It is to be noted that the solid-state image sensor may include the ranging pixels 110 that each divide the incident light beam in the X-direction and the ranging pixels 410 that each divide the incident light beam in the Y-direction. With such a configuration, the distance can be measured irrespective of the direction of contrast of a target of imaging. Even in this case, the cross-sectional areas of the cores in the waveguides or the difference between the refractive indices of a core and a clad may be determined in accordance with the shift direction of the microlens and the direction in which the plurality of waveguides are arrayed.

Fifth Exemplary Embodiment

Figure 13:
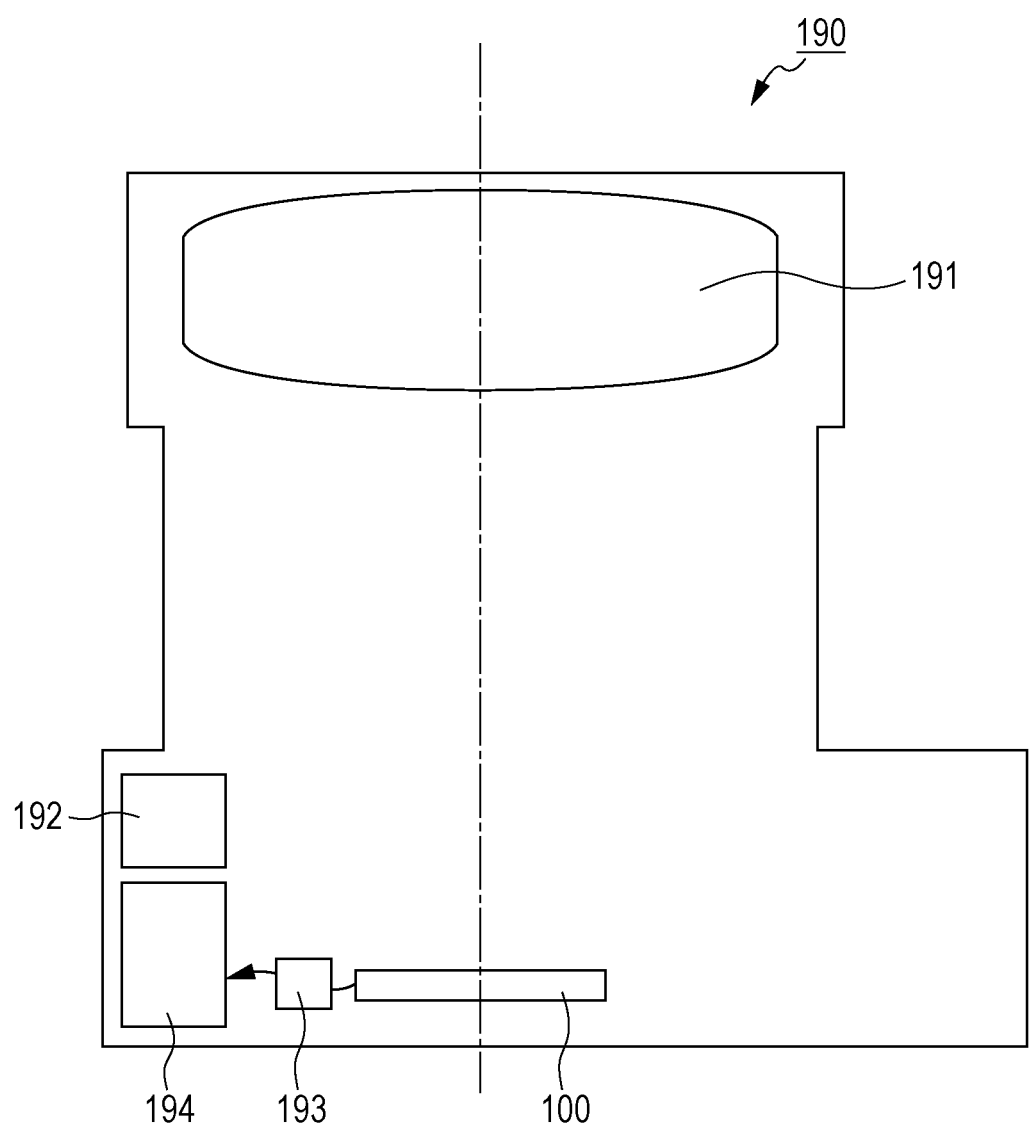
FIG. 13 is a schematic diagram illustrating an example of an image-capturing device according to a fifth exemplary embodiment.

FIG. 13 is a schematic diagram of an image-capturing device 190, such as a digital still camera and a digital video camera, that includes the solid-state image sensor 100 according to the first exemplary embodiment. The image-capturing device 190 includes, aside from the solid-state image sensor 100, an imaging optical system 191, a central processing unit (CPU) 192, a transfer circuit 193, and a signal processing unit 194, and the imaging optical system 191 is disposed on the light-incident side relative to the solid-state image sensor 100. The CPU 192 controls the operations of the transfer circuit 193 and the signal processing unit 194. Signals obtained by the photoelectric conversion units 122 and 123 are transferred to the signal processing unit 194 through the transfer circuit 193, and ranging images are formed by the signal processing unit 194. The ranging images are then compared by the signal processing unit 194, and thus the distance is measured. In a similar manner, the signals obtained by the photoelectric conversion units 122 and 123 are processed by the signal processing unit 194 and are also used as signals for a captured image.

Other Exemplary Embodiments

Although an example in which two waveguides and two photoelectric conversion units are provided has been illustrated in each of the first through fifth exemplary embodiments, three or more waveguides and three or more photoelectric conversion units may be provided. Even in a case in which three or more waveguides and three or more photoelectric conversion units are provided, it is sufficient if at least two among the three or more waveguides satisfy the configuration described below. Specifically, it is sufficient if the cross-sectional area of the core in one of the two waveguides that is disposed on a side of the center axis of the ranging pixel that is in a direction opposite to the projection shift direction of the microlens is greater than the cross-sectional area of the core in the other waveguide disposed on another side of the center axis of the ranging pixel that is in a direction identical to the projection shift direction of the microlens. Alternatively, it is sufficient if the difference between the refractive indices of the core and the clad in one of the two waveguides that is disposed on a side of the center axis of the ranging pixel that is in a direction opposite to the projection shift direction of the microlens is greater than the difference between the refractive indices of the core and the clad in the other waveguide disposed on another side of the center axis of the ranging pixel that is in a direction identical to the projection shift direction of the microlens. With such a configuration, the difference between the maximum sensitivities of the plurality of photoelectric conversion units can be reduced, and thus the accuracy in measuring the distance is improved.

In addition, a plurality of photoelectric conversion units that divide an incident light beam in the X-direction and a plurality of photoelectric conversion units that divide an incident light beam in the Y-direction may be provided in a single ranging pixel. Even in such a case, it is sufficient if the cross-sectional area of the core in one of the plurality of waveguides that is disposed on a side of the center axis of the ranging pixel that is in a direction opposite to the projection shift direction of the microlens is greater than the cross-sectional area of the core in another one of the plurality of waveguides disposed on another side of the center axis of the ranging pixel that is in a direction identical to the projection shift direction of the microlens. Alternatively, it is sufficient if the difference between the refractive indices of the core and the clad in one of the plurality of waveguides that is disposed on a side of the center axis of the ranging pixel that is in a direction opposite to the projection shift direction of the microlens is greater than the difference between the refractive indices of the core and the clad in another one of the plurality of waveguides disposed on another side of the center axis of the ranging pixel that is in a direction identical to the projection shift direction of the microlens.

In addition, the exemplary embodiments described above may be combined as appropriate, if applicable.

According to the present invention, the distance can be measured with high accuracy even in a peripheral region of a solid-state image sensor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-025834, filed Feb. 13, 2014, which is hereby incorporated by reference herein in its entirety.

What is claimed is:

1. A solid-state image sensor comprising one or more pixels, the one or more pixels each including a microlens, a plurality of photoelectric conversion units, and a plurality of waveguides disposed between the microlens and the plurality of photoelectric conversion units so as to correspond to the plurality of photoelectric conversion units, the plurality of waveguides each including a core and a clad,
wherein, in at least two of the pixels that are located in a peripheral region of the solid-state image sensor,
the microlens is so disposed that a center axis thereof is shifted relative to a center axis of the pixel,
the plurality of waveguides includes a first waveguide and a second waveguide,
the first waveguide is disposed on a side of the center axis of the pixel that is in a direction opposite to a direction obtained by projecting a shift direction of the microlens onto a straight line connecting a center of the first waveguide and a center of the second waveguide,
the second waveguide is disposed on another side of the center axis of the pixel that is in a direction identical to the direction obtained by projecting the shift direction of the microlens onto the straight line,
a cross-sectional area of the core in the first waveguide is greater than a cross-sectional area of the core in the second waveguide, and
the at least two of the pixels in which the microlenses are disposed such that shift amounts of the microlenses are different from each other are disposed in the peripheral region,
wherein the at least two of the pixels include a first pixel and a second pixel,
wherein shift amount of the microlens of the first pixel is greater than shift amount of the microlens of the second pixel, and
wherein a value representing a ratio of the cross-sectional area of the core in the first waveguide to the cross-sectional area of the core in the second waveguide in the first pixel is greater than a value representing a ratio of the cross-sectional area of the core in the first waveguide to the cross-sectional area of the core in the second pixel.

2. The solid-state image sensor according to claim 1, wherein a width of the core in the first waveguide in an array direction in which the first waveguide and the second waveguide are arrayed is greater than a width of the core in the second waveguide in the array direction.

3. The solid-state image sensor according to claim 1, wherein the plurality of photoelectric conversion units include a first photoelectric conversion unit that corresponds to the first waveguide and a second photoelectric conversion unit that corresponds to the second waveguide, and
an area of the first photoelectric conversion unit is greater than an area of the second photoelectric conversion unit.

4. The solid-state image sensor according to claim 3, wherein a value representing a ratio of the area of the first photoelectric conversion unit to the area of the second photoelectric conversion unit is greater than a value representing a ratio of the cross-sectional area of the core in the first waveguide to the cross-sectional area of the core in the second waveguide.

5. The solid-state image sensor according to claim 1, wherein the one or more pixels include a plurality of pixels, and
a sum of the cross-sectional areas of the cores in the plurality of waveguides is constant among the plurality of pixels.

6. The solid-state image sensor according to claim 1, wherein the microlens is shifted toward a center of the solid-state image sensor.

7. The solid-state image sensor according to claim 1, wherein the peripheral region is a region that is spaced apart from a center of the solid-state image sensor by a distance that is no less than 0.25 times a length of a diagonal line of the solid-state image sensor.

8. The solid-state image sensor according to claim 1, wherein, in at least two pixels located in the peripheral region, a shift amount of the microlens in one of the at least two pixels that is farther from a center of the solid-state image sensor is greater than a shift amount of the microlens in another one of the at least two pixels that is closer to the center of the solid-state image sensor.

9. The solid-state image sensor according to claim 1, further comprising:

a pixel in which the microlens is disposed so as to be coaxial with the pixel.

10. The solid-state image sensor according to claim 1, further comprising:
a pixel in which a shift direction in which the microlens is shifted is orthogonal to an array direction in which the plurality of waveguides are arrayed,
wherein a difference between refractive indices of the core and the clad is constant among the plurality of waveguides, and the cross-sectional areas of the cores in the plurality of waveguides are equal to one another in the pixel in which the shift direction is orthogonal to the array direction.

11. The solid-state image sensor according to claim 1, wherein the pixel is provided in a central region of the solid-state image sensor.

12. The solid-state image sensor according to claim 1, further comprising:
an image-capturing pixel that includes a microlens, a single photoelectric conversion unit, and a single waveguide disposed between the microlens and the single photoelectric conversion unit, the single waveguide including a core and a clad.

13. An image-capturing device, comprising:
the solid-state image sensor according to claim 1; and
an imaging optical system disposed closer to a light-incident side of the image-capturing device than the solid-state image sensor.

14. A solid-state image sensor comprising one or more pixels, the one or more pixels each including a microlens, a plurality of photoelectric conversion units, and a plurality of waveguides disposed between the microlens and the plurality of photoelectric conversion units so as to correspond to the plurality of photoelectric conversion units, the plurality of waveguides each including a core and a clad,
wherein, in at least two of the pixels that are located in a peripheral region of the solid-state image sensor,
the microlens is so disposed that a center axis thereof is shifted relative to a center axis of the pixel,
the plurality of waveguides includes a first waveguide and a second waveguide,
the first waveguide is disposed on a side of the center axis of the pixel that is in a direction opposite to a direction obtained by projecting a shift direction of the microlens onto a straight line connecting a center of the first waveguide and a center of the second waveguide,
the second waveguide is disposed on another side of the center axis of the pixel that is in a direction identical to the direction obtained by projecting the shift direction of the microlens onto the straight line, and
a difference between refractive indices of the core and the clad in the first waveguide is greater than a difference between refractive indices of the core and the clad in the second waveguide,
wherein the at least two of the pixels include a first pixel and a second pixel,
wherein shift amount of the microlens of the first pixel is greater than shift amount of the microlens of the second pixel, and
wherein a value representing a ratio of the difference between the refractive indices of the core and the clad in the first waveguide to the difference between the refractive indices of the core and the clad in the second waveguide in the first pixel is greater than a value representing a ratio of the difference between the refractive indices of the core and the clad in the first waveguide to the difference between the refractive indices of the core and the clad in the second waveguide in the second pixel.

15. The solid-state image sensor according to claim 14, wherein the refractive index of the core in the first waveguide is greater than the refractive index of the core in the second waveguide.

16. The solid-state image sensor according to claim 14, wherein the refractive index of the clad in the first waveguide is greater than the refractive index of the clad in the second waveguide.

* * * * *